United States Patent
Hu et al.

(10) Patent No.: US 10,992,129 B2
(45) Date of Patent: Apr. 27, 2021

(54) GROUND FAULT PROTECTION METHODS

(71) Applicant: GE Energy Power Conversion Technology Ltd, Rugby (GB)

(72) Inventors: Lihua Hu, Rugby (GB); Teng Long, Rugby (GB); Martin Samuel Butcher, Rugby (GB); Allan David Crane, Rugby (GB)

(73) Assignee: GE ENERGY POWER CONVERSION TECHNOLOGY LTD., Warwickshire (GB)

( * ) Notice: Subject to any disclaimer, the term of this patent is extended or adjusted under 35 U.S.C. 154(b) by 592 days.

(21) Appl. No.: 15/754,783

(22) PCT Filed: Aug. 22, 2016

(86) PCT No.: PCT/GB2016/052593
§ 371 (c)(1),
(2) Date: Feb. 23, 2018

(87) PCT Pub. No.: WO2017/032992
PCT Pub. Date: Mar. 2, 2017

(65) Prior Publication Data
US 2018/0241200 A1    Aug. 23, 2018

(30) Foreign Application Priority Data
Aug. 25, 2015  (EP) .................................. 15182373

(51) Int. Cl.
*H02H 7/26* (2006.01)
*H02H 3/16* (2006.01)
(Continued)

(52) U.S. Cl.
CPC ............. *H02H 7/26* (2013.01); *G01R 31/086* (2013.01); *G01R 31/50* (2020.01);
(Continued)

(58) Field of Classification Search
CPC ........ H02H 7/26; H02H 3/162; H02H 1/0007; G01R 31/50; G01R 31/086; G01R 19/2513; G01R 23/16; G01R 31/52; Y04S 10/52
(Continued)

(56) References Cited

U.S. PATENT DOCUMENTS

| 4,878,142 A | 10/1989 | Bergman et al. |
| 2013/0027077 A1 | 1/2013 | Oughton, Jr. et al. |
| 2013/0258537 A1* | 10/2013 | Wylie ...................... H02H 3/08 361/87 |

OTHER PUBLICATIONS

Baldwin, T., et al., "Directional Ground-Fault Indicator for High-Resistance Grounded Systems," IEEE Transactions on Industry Applications, vol. 39, Issue 2, pp. 325-332 (Mar. 26, 2003).
(Continued)

*Primary Examiner* — Dharti H Patel
(74) *Attorney, Agent, or Firm* — Wood IP LLC

(57) ABSTRACT

A power distribution system includes power converter systems electrically connected to a distribution bus which defines a point of common coupling. Each power converter system includes a power converter with semiconductor switching devices controlled using a pulse width modulation strategy with a switching frequency. A controller for each power converter system applies a spectrum analysis process to the respective power converter system that uses measured or derived zero sequence currents associated with the respective power converter system to determine the location of a ground fault within the power distribution system. Each controller applies a switching frequency process where the switching frequency of the power converter of at least one of the power converter systems is different from the switching frequency of the power converter of at least another one of the power converter systems during at least part of the time that the spectrum analysis process is applied.

14 Claims, 12 Drawing Sheets

(51) Int. Cl.
    *G01R 31/50*     (2020.01)
    *G01R 31/08*     (2020.01)
    *H02H 1/00*     (2006.01)
    *G01R 19/25*     (2006.01)
    *G01R 23/16*     (2006.01)

(52) U.S. Cl.
    CPC .......... *H02H 1/0007* (2013.01); *H02H 3/162* (2013.01); *G01R 19/2513* (2013.01); *G01R 23/16* (2013.01)

(58) Field of Classification Search
    USPC .......................................................... 361/42
    See application file for complete search history.

(56) References Cited

OTHER PUBLICATIONS

Extended European Search Report and Opinion issued in connection with corresponding EP Application No. 15182373.9 dated Feb. 4, 2016.

International Search Report and Written Opinion issued in connection with corresponding PCT Application No. PCT/GB2016/052593 dated Nov. 11, 2016.

\* cited by examiner

GROUND FAULT PROTECTION METHODS

FIELD OF THE INVENTION

The present invention relates to ground fault protection of power distribution systems, particularly those systems in which a plurality of power converter systems are interconnected by a point of common coupling without the use of isolating transformers or any form of low resistance grounding network. The present invention addresses the difficulty in achieving ground fault discrimination in such "floating" or high resistance grounded systems.

BACKGROUND OF THE INVENTION

It is known that when a ground fault is present in a transformerless, high resistance grounded, power distribution system that interconnects a plurality of power converter systems (e.g., variable speed drive (VSD) systems), the voltages to ground in all parts of the system are affected by the presence of the ground fault, wherever the ground fault is located. Consequently, there is a requirement to precisely identify the location of such a ground fault, take protective actions to isolate that fault as soon as possible, and for this to be achieved without the operation of non-faulted equipment being disturbed. Non-faulted equipment that is electrically connected to such a power distribution system is expected to operate briefly under the associated additional voltage stress while these protective actions are being carried out.

An example of a conventional transformerless, high resistance grounded, power distribution system is shown in FIG. 1. The power distribution system 1 provides power to four VSD systems $2_1$-$2_4$. Each VSD system 2 is electrically connected to a distribution bus 5 that defines a point of common coupling and includes a power converter 3 of the back to back pulse width modulation (PWM) voltage source inverter (VSI) type and an ac line filter 6. Each VSD system 2 is used to interface an electrical machine 7 (e.g., a motor) to the distribution bus 5. The power distribution system 1 shown in FIG. 1 is for a marine vessel (e.g., a ship, drilling rig or any other surface-going vessel or platform or submersible (submarine) vessel) but it will be understood that similar power distribution systems can be used for other applications.

Each power converter 3 includes a supply bridge 3A having ac terminals electrically connected to a distribution bus 5 and a machine bridge 3B electrically connected to the electrical machine 7. The machine bridge 3B will often be directly connected to the electrical machine 7, but it can also be indirectly connected by a filter, e.g., a sine wave filter. The dc output of each supply bridge 3A is electrically connected to the dc input of the machine bridge 3B by a dc link 3C. The supply bridge 3A and machine bridge 3B are active rectifier/inverters with a plurality of semiconductor switching devices controlled using a PWM strategy. The supply bridge 3A of each power converter 3 is electrically connected to the distribution bus 5 by the ac line filter 6.

Each ac line filter 6 includes a first filter reactor 6A, a second filter reactor 6B and an additional filter component 6C. The ac line filter 6 also includes a filter capacitor 6D that is connected to ground. As used herein, the subscripts 1 to 4 are used to indicate components or operating parameters of the first, second, third and fourth VSD systems $2_1$-$2_4$, respectively. This includes indicating components or operating parameters of the power converter 3 and the ac line filter 6. For example, the supply bridge $3A_1$ is the supply bridge of the first power converter $3_1$ which forms part of the first VSD system $2_1$.

In normal operation, each supply bridge 3A will operate as an active rectifier to supply power to the dc link 3C and each machine bridge 3B will operate as an inverter to supply power to the respective machine 7. But it will be readily appreciated that in some situations, the direction of power flow may be reversed, e.g., if a particular machine 7 is operated in a generating mode or experiencing regenerative braking where power is supplied to the distribution bus 5. In this case, the machine bridge 3B of the associated VSD system 2 will operate as an active rectifier to supply power from the machine 7 to the dc link 3C and the supply bridge 3A will operate as an inverter to supply power to the distribution bus 5.

Generators 4 (e.g., diesel generators) supply power to the distribution bus 5. The power distribution system 1 will typically include a first bus section and a second bus section that are interconnected by a bus tie. Some power distribution systems use a plurality of bus sections interconnected by a plurality of bus ties to improve power availability.

As noted above, the direction of power flow is generally from the generators 4 to the machines $7_1$-$7_4$ through the distribution bus 5, the ac line filters $6_1$-$6_4$ and the respective power converters $3_1$-$3_4$. The normal working mean voltage to ground throughout the power distribution system 1 is defined by at least one high resistance grounding resistor 8 whereas the non zero frequency symmetry of the normal working ac phase voltage relative to ground is defined by the capacitance to ground of the ac line filters $6_1$-$6_4$. During ground faults, the voltages to ground throughout the power distribution system 1 experience perturbations from their normal working conditions and these perturbations are dependent on the nature and location of the ground fault. These ground faults also cause abnormal zero sequence currents to flow throughout the power distribution system 1. As used herein, the term 'zero sequence current' refers to the residual component of current after summation of the individual ac line currents of a polyphase system. It will be readily appreciated that the zero sequence currents do not experience phase rotation. Since such a power distribution system is typically extensive and includes a number of items of equipment that routinely generate common mode voltages and/or have deliberate or parasitic capacitance to ground, it is generally the case that a wide spectrum of zero sequence currents flow throughout the system when in normal operation, albeit of controlled magnitude.

Three different types of ground fault are identified in FIG. 1 and are labelled 'type 1', 'type 2' and 'type 3', respectively. A type 1 ground fault is a ground fault in one of the supply ac lines $9_1$-$9_4$ (i.e., the ac lines between the distribution bus 5 and the respective supply bridge $3A_1$-$3A_4$, including the ac line filter $6_1$-$6_4$), a type 2 ground fault is a ground fault in the dc link 3C of the power converter and a type 3 ground fault is a ground fault in one of the machine ac lines $10_1$-$10_4$ (i.e., the ac lines between the machine bridge 3B and the respective machine $7_1$-$7_4$). If each VSD drive includes a filter, e.g., a sine wave filter (not shown), between the machine bridge and the machine, a type 3 ground fault will typically have similar characteristics to a type 1 ground fault.

A number of techniques have been developed to allow ground faults to be detected and zero sequence current detection means are commonly employed for this purpose. Zero sequence currents are typically detected by core balance current transformers (CBCTs) and simplistic detectors.

But these devices have only a limited ability to discriminate between zero sequence fault currents and the zero sequence currents associated with normal operation. This discrimination can be made ineffective when zero sequence fault currents flow in healthy or non-faulted equipment as a result of the above perturbations in voltages to ground when a ground fault is present, and in the worst case can result in the unnecessary tripping of non-faulted equipment.

In another well-known ground fault detection system based upon the use of current transformers, a dedicated pulse generator injects a known spectrum of zero sequence voltages into the distribution bus at a high level in the power distribution system. The current transformers and a specialised detector are used to identify the abnormal zero sequence currents that are associated with a ground fault in a particular branch of the power distribution system. This method is calibrated to measure branch insulation resistance, despite there potentially being a large distributed capacitance to ground. In practice, this method has inadequate signal to noise ratio to operate effectively in systems that employ back to back PWM VSIs with significant supply side capacitive ac line filters.

It is common practice to use voltage detectors to identify the presence of the abnormal common mode voltages that are associated with ground faults when the VSD systems benefit from an isolating transformer power supply. Such VSD systems are similar to the VSD systems $2_1$-$2_4$ shown in FIG. 1 but the coupling between the distribution bus 5 and the ac line filter 6 is by means of a transformer, which provides galvanic isolation. The common mode voltages CMV1 and CMV2 may be detected when a type 1, type 2, or type 3 ground fault is present. For example, when a supply isolation transformer is used, this provides common mode voltage isolation between the distribution bus and the associated VSD system and it is common practice to sense the voltage between the mid-point of the dc link 3C and ground in order to locate a ground fault. This also allows the ground fault type to be discriminated as follows:

a type 1 ground fault causes the dc mid-point voltage to be offset from its normal condition by the distribution phase voltage a type 2 ground fault causes the dc mid-point voltage to be offset from its normal condition by Vdc/2 a type 3 ground fault causes the dc mid-point voltage to be offset from its normal condition by the machine phase voltage The voltage offsets that are experienced in the cases of type 2 and type 3 ground faults include all spectral components of the respective phase voltage, i.e., a classical PWM spectrum, and it is known for the detection of these voltages to be performed by techniques ranging from the use of passively filtered detectors to sophisticated signature-based detectors. When signature-based detectors are used, these are based upon the principle that the detector will have an inbuilt knowledge of the PWM spectra of the associated power converter.

However, when a supply isolation transformer is not provided, as in the case for the power distribution system 1 shown in FIG. 1, the common mode voltages CMV1 and CMV2 may be detected in all of the VSD systems $2_1$-$2_4$ that are electrically connected to the point of common coupling provided by the distribution bus 5 when a ground fault of type 1, type 2, or type 3 is present in just one of the VSD systems. Such power distribution systems are commonly known as transformerless systems and are known not to be capable of providing ground fault protection discrimination when the above types of common mode voltage detection are employed.

The voltage sensing method has also been applied to ac lines by detecting the voltage between an artificial neutral point (the mid-point of a star (wye) connected resistive network) and ground. This form of voltage sensing is also compromised when a supply isolation transformer is not provided.

The above-described method of detecting zero sequence currents using CBCTs and RMS detectors has been enhanced to allow the spectral content of the zero sequence component of ac line currents to be resolved in order to determine whether normal or ground faulted conditions are present. However, when a supply isolation transformer is not provided, the common mode voltages CMV1 and CMV2, in being impressed upon all parts of the power distribution system, cause zero sequence currents to be detected in all of the VSD systems that are electrically connected to the point of common coupling provided by the distribution bus when a ground fault of type 1, type 2, or type 3 is present in just one of the VSD systems. The propagation of ground fault-related zero sequence currents into the ac line filters of otherwise healthy or non-faulted VSD systems is governed by the interconnecting zero sequence impedances and the nature of the ac line filters—it generally being the case that these ac line filters have significant capacitance to ground in order to comply with Electromagnetic Compatibility (EMC) legislation. In practice, when a single VSD system experiences a type 2 or type 3 ground fault, all of the VSD systems experience similar zero sequence components of ac line currents and such a detection system is not capable of providing ground fault protection discrimination. When a single VSD system experiences a type 1 ground fault, if the grounding resistance and EMC capacitance are suitably designed, it can be possible for a detection system to be capable of providing ground fault protection discrimination. It is known that the failure to provide this discrimination or ground fault location can result in the tripping of all VSD systems that are electrically connected to the point of common coupling even though some of the VSD systems are healthy.

Similar methods have been applied to ground fault detection in power distribution systems with multiple VSD systems having a point of common coupling that is a dc distribution bus as opposed to the ac distribution bus shown in FIG. 1.

Signature-based ground fault detection methods have become increasingly sophisticated yet fail to provide reliable ground fault discrimination in power distribution systems that employ a plurality of identical or similar VSD systems. It has proven to be difficult to provide the required detection dependability and response time for all operating conditions and fault conditions.

SUMMARY OF THE INVENTION

The present invention provides a ground fault protection method for a power distribution system comprising a plurality of power converter systems electrically connected to a point of common coupling (e.g., a distribution bus), each power converter system including a power converter with a plurality of semiconductor switching devices controlled using a pulse width modulation (PWM) strategy with a switching frequency, the method comprising applying a spectrum analysis process to each power converter system that uses measured or derived zero sequence currents associated with the respective power converter system to determine the location of a ground fault within the power distribution system, and a switching frequency process where the switching frequency of the power converter of at least one of the power converter systems is different from the switching frequency of the power converter of at least another one of the power converter systems (i.e., so that the power converters of at least two of the plurality of power converter systems have a different switching frequency) during at least part of the time that the spectrum analysis process is applied.

The present invention further provides a power distribution system comprising a plurality of power converter systems electrically connected to a point of common coupling, each power converter system including a power converter with a plurality of semiconductor switching devices controlled using a PWM strategy with a switching frequency, wherein the power distribution system further includes a controller for each power converter system, each controller being adapted to apply a spectrum analysis process to the respective power converter system that uses measured or derived zero sequence currents associated with the respective power converter system to determine the location of a ground fault within the power distribution system, and each controller being adapted to apply a switching frequency process where the switching frequency of the power converter of at least one of the power converter systems is different from the switching frequency of the power converter of at least another one of the power converter systems during at least part of the time that the spectrum analysis process is applied.

The spectrum analysis process can also be used to initially detect the presence of a ground fault at an unspecified location within the power distribution system.

The spectrum analysis process applied to each power converter system can comprise the steps of:
  measuring or deriving zero sequence currents associated with the respective power converter system;
  a. performing spectrum analysis on the zero sequence currents and deriving the amplitude of a frequency component within the zero sequence current frequency spectrum; and
  b. comparing the derived amplitude against a threshold or at least one stored amplitude (e.g., an amplitude of the same frequency component previously derived from the spectrum analysis process and stored in a suitable memory).

The steps will typically be repeated such that the spectrum analysis process derives a series of amplitudes while it is applied to each power converter system.

The frequency component within the zero sequence current frequency spectrum will normally be the fundamental component or an integer or non-integer harmonic component of the switching frequency of the power converter of the respective power converter system. For example, if a power converter has a switching frequency (or carrier frequency) of 2.5 kHz, the frequency component will normally be 2.5 kHz or an integer or non-integer harmonic component of 2.5 kHz. The amplitude of two or more different frequency components can be derived simultaneously within the zero sequence current frequency spectrum and each amplitude can be compared against a respective threshold or stored amplitude(s). Additional frequency components within the zero sequence current frequency spectrum can be the fundamental component or an integer or non-integer harmonic component of the distribution voltage frequency (e.g., 50 or 60 Hz for a conventional power distribution system) and the fundamental component or an integer or non-integer harmonic component of the machine stator or load voltage frequency. The additional frequency components can optionally be used to determine the location of the ground fault within the respective power converter system, i.e., to determine if the ground fault is a type 1, type 2 or type 3 ground fault where appropriate.

The amplitude of the frequency component(s) within the zero sequence current frequency spectrum can be derived using any suitable and time-efficient digital signal processing (DSP) technique including inter alia synchronous discrete Fourier transform (DFT), Goertzel algorithm (or filter) and heterodyne with frequency. The spectrum analysis process is used to reliably and rapidly detect the amplitude of the frequency component(s) within the complete spectrum of zero sequence currents. Each frequency component is known and can be provided as an input to the spectrum analysis process. For example, the controllers will normally be provided with data that includes inter alia the prevailing PWM switching frequency, the distribution voltage frequency and the machine stator or load voltage frequency to allow the controllers to carry out routine operational control of the power converters. The sampling rate of a synchronous DFT in an embodiment is synchronised to the PWM generator for the respective power converter. The Goertzel filter is a simplified and computationally more efficient version of the DFT that is adapted to identify a single frequency and has a similar function to the DFT. With heterodyne technique the heterodyne frequency is identical to the required frequency component and the method is concluded by detecting that the difference frequency output is zero. Some DSP techniques will be followed by amplitude detection.

If a derived amplitude exceeds a fault detection threshold, the spectrum analysis process can generate a signal indicative of a ground fault being present at an unspecified location within the power distribution system (a 'fault detection signal'). If an amplitude exceeds a fault location threshold, the spectrum analysis process can generate a signal indicative of a ground fault being present within the respective power converter system (a 'fault location signal'). A fault detection signal or a fault location signal can also be generated based on the comparison between a derived amplitude and one or more stored amplitudes, e.g., if a derived amplitude exceeds a stored amplitude optionally by a predetermined margin. Such a comparison can identify variations in the amplitudes at the frequency component that can indicate the presence of a ground fault at an unspecified location within the power distribution system or within the respective power converter system.

The simultaneously-derived amplitudes within the zero sequence current frequency spectrum can be identified generally as A1(F1), A2(F2)-An(Fn) where A1 is the amplitude at a first frequency component F1, A2 is the amplitude at a second frequency component F2 and An is the amplitude at an nth frequency component Fn. Thresholds can be identified generally as T1(F1), T1(F1)-Tn(Fn) where T1 is the threshold at the first frequency component F1, T2 is the threshold at the second frequency component F2 and Tn is the threshold at the nth frequency component Fn. It can therefore be understood that each amplitude and each threshold are a function of the corresponding frequency component. The simultaneously-derived amplitudes A1(F1)-An(Fn) can be compared against a respective threshold (e.g., a fault detection threshold D1(F1)-Dn(Fn) and/or a fault location threshold L1(F1)-Ln(Fn) for the particular frequency component F1-Fn).

The spectrum analysis process can be continuously applied to each power converter system by the respective controller.

Each threshold can be preset for the particular power converter system or derived using one of more of the following power converter system parameters as appropriate:
- supply ac line voltage
- dc link voltage
- load ac line voltage
- supply ac line frequency
- load ac line frequency
- PWM control strategy parameters
- impedance data for any associated ac line filter
- impedance data for any system zero sequence stray and/or parasitic components It follows that each threshold can be a fixed (or preset) threshold or a variable threshold, e.g., it can vary in response to changes in the power converter system parameters. Each threshold may be derived using a look-up table which may be based on data obtained during system commissioning or during normal operation. One or more of the power converter system parameters can be used as a pointer to the look-up table, which is effectively a series of preset thresholds.

If a fault location signal is generated by the spectrum analysis process it can be used to open a protective circuit breaker/switchgear for the respective power converter system to isolate it from the point of common coupling (e.g., a distribution bus to which the power converter systems are electrically connected) and/or trip the power converter system. An objective of the present invention is to maximise power distribution system and associated equipment availability. This involves utilising the method to avoid having to open protective circuit breakers/switchgear for all of the power converter systems. Ideally, the presence of a ground fault anywhere within a power converter system will cause only the tripping of the faulty power converter system and its isolation from the point of common coupling.

The proposed method and system are robust, fast-acting and dependable. It will be readily appreciated that there is a practical need for such a method because if an unspecified ground fault cannot be properly located, it is normally necessary to simultaneously trip all equipment that is electrically connected to the point of common coupling to which a faulty power converter system is also connected. In the case of a marine power distribution and propulsion system, for example, this could lead to a complete loss of propulsive power without warning and the consequence could be the inability of a marine vessel using dynamic positioning to maintain station keeping or the inability for any type of marine vessel to complete a safety-critical manoeuvre. It will also be readily appreciated that healthy or non-faulted equipment in a power distribution system that employs high resistance grounding is generally expected to maintain full functionality while a ground fault is present elsewhere in the system, also that the non-faulted equipment is subjected to increased voltage to ground stress until the ground fault is removed. Moreover, the probability of a second ground fault occurring increases with the duration of operation with a first ground fault present, and the consequence of two ground faults being present simultaneously is serious in as much as high fault currents flow and equipment damage occurs until the fault current is interrupted. The consequence of a double ground fault is that the power distribution system is typically rendered inoperative until major repair work is completed.

The spectrum analysis process is able to identify when the source of ground fault current is specific to a particular power converter system. Having achieved rapid discrimination of the location of a ground fault, the corresponding protective circuit breaker/switchgear can be instructed to open and isolate the ground fault before a conventional ground fault protective process effects a less selective tripping and shutdown of the power distribution system.

Different switching frequency processes can be used to ensure that the power converters of at least two of the power converter systems have different switching frequencies during at least part of the time that the spectral analysis process is applied to the power converter systems.

In a first switching frequency process the power converters can be operated continuously at different fixed switching frequencies. For example, if the power distribution system includes three power converter systems, the power converter of the first power converter system can be operated at a first switching frequency (e.g., 2.0 kHz), the power converter of the second power converter system can be operated at a second switching frequency (e.g., 2.5 kHz) and the power converter of the third power converter system can be operated at a third switching frequency (e.g., 3.0 kHz). The power converters will be operated at these different switching frequencies during both ground fault and normal operating conditions.

In a second switching frequency process the power converters can be operated continuously at a pseudo-random series of different switching frequencies. The randomness can be defined such that the probability of two or more power converters having the same switching frequency at any specified time period would be sufficiently low and that successive displacements of switching frequency from the mean switching frequency would be sufficiently high for the spectrum analysis process to be effective. For example, if the power distribution system includes three power converters, the power converter of the first power converter system can be operated at a first pseudo-random series of switching frequencies within a range of switching frequencies (e.g., between 2.0 and 3.0 kHz), the power converter of the second power converter system can be operated at a second pseudo-random series of switching frequencies within a range of switching frequencies (e.g., between 2.0 and 3.0 kHz) and the power converter of the third power converter system can be operated at a third pseudo-random series of switching frequencies within a range of switching frequencies (e.g., between 2.0 and 3.0 kHz). The power converters will be operated at these different pseudo-random series of switching frequencies during both ground fault and normal operating conditions. The switching frequency range can be the same for all power converters or different.

In a third switching frequency process the power converters can be operated at a switching frequency during normal operation (a 'nominal switching frequency') and a switching frequency operation is then sequentially applied to each power converter system without overlap, i.e., so that a switching frequency operation is not applied simultaneously to power converters in different power converter systems, in response to ground fault detection. During each switching frequency operation, the respective power converter is operated for a predetermined period of time at a switching frequency that is different from the nominal switching frequency (a 'displaced switching frequency'). At the end of each switching frequency operation, the respective power converter reverts back to being operated at the nominal switching frequency. Such a switching frequency process can be particularly useful because the power converters can use the same nominal switching frequency during normal operation of the power distribution system and the switching frequency is only changed to the displaced switching frequency when a switching frequency operation is applied to the power converter system during a ground fault.

The switching frequency operations of the third switching frequency process are normally applied sequentially to each power converter system in turn once an unspecified ground fault has been detected. For example, if the power distribution system includes three power converter systems, the switching frequency operation is applied to the power converter of the first power converter system, then to the power converter of the second power converter system, and finally to the power converter of the third power converter system. During each switching frequency operation, the switching frequency of the respective power converter is changed from the nominal switching frequency (e.g., 2.5 kHz) to the displaced switching frequency (e.g., 2.5 kHz±ΔF) for a predetermined period of time. When a switching frequency operation is applied to a power converter system, the spectrum analysis process can derive the amplitude of the fundamental component or an integer or non-integer harmonic component of the displaced switching frequency. For example, if the displaced switching frequency is 2.0 kHz, the frequency component will be 2.0 kHz or an integer or non-integer harmonic component of 2.0 kHz. At the end of each switching frequency operation, the switching frequency of the power converter reverts back to the nominal switching frequency. The spectrum analysis process can switch between different frequency components as the switching frequency operation is applied to the respective power converter system. In other words, the spectrum analysis can derive simultaneously the amplitudes of a first frequency component which is the fundamental component or an integer or non-integer harmonic component of the nominal switching frequency (e.g., a frequency component of 2.5 kHz) when the power converter is operating at the nominal switching frequency and which switches to the fundamental component or an integer or non-integer harmonic component of the displaced switching frequency (e.g., a frequency component of 2.0 kHz) when the switching frequency operation is applied and the power converter is operating at the displaced switching frequency. The spectrum analysis process can also derive the amplitudes of a first frequency component which is the fundamental component or an integer or non-integer harmonic component of the nominal switching frequency (e.g., a frequency component of 2.5 kHz) and derive the amplitudes of a second frequency component which is the fundamental component or an integer or non-integer harmonic component of the displaced switching frequency (e.g., a frequency component of 2.0 kHz) during the duration of the third switching frequency process. In other words, the spectrum analysis process can derive the amplitudes of the second frequency component even when the switching frequency operation is not being applied to the respective power converter system such that its power converter is still operating at the nominal switching frequency and vice versa.

The switching frequency can be controlled by the PWM generator for each power converter, for example. In the above example, only one power converter will be operating at the displaced switching frequency at any particular time. Once the power converter of a power converter system has reverted back to the nominal switching frequency (i.e., the switching frequency operation for that power converter system has ended), there can be a delay before the switching frequency operation is applied to the next power converter system. Put another way, there can be a gap between each of the switching frequency operations. The gaps can avoid an overlap of switching frequency operations if the switching frequency process is not initiated in each power converter system at exactly the same time.

A plurality of power converter systems electrically connected to a point of common coupling must be considered to be a distributed broadband noise source and hence such a power distribution system constitutes an extremely electrically noisy environment. The nature of the problem to be solved is therefore one of achieving an adequately discriminating signal to noise ratio and response time. The signal to noise ratio can be improved by continuously operating the power converters at different fixed switching frequencies (first switching frequency process) or at a pseudo-random series of different switching frequencies (second switching frequency process) during both ground fault and normal operating conditions. The pseudo-random PWM control strategy can be specified so that the power converters operate at different switching frequencies for the statistical majority of time. In the case of the third switching frequency process, the displaced switching frequency for each power converter in an embodiment is in a low-noise area of the zero sequence current frequency spectrum such that the signal to noise ratio for the spectrum analysis process is improved significantly when a switching frequency operation is applied to the power converter system. The improvement in the signal to noise ratio arises because only one power converter system has the harmonics that relate to the displaced switching frequency and consequently the noise from the remaining power converter systems that continue to operate at the nominal switching frequency is avoided. Moreover, the displaced switching frequency is in an embodiment selected so that it does not correspond to any significant harmonics of the nominal switching frequency. The difference between the nominal and the displaced switching frequencies (i.e., ΔF) is selected appropriately by the PWM generator. Often the power converters in a particular power distribution system will have the same fixed nominal switching frequency and will be operated at the same displaced switching frequency when the switching frequency operation is applied. But the power converters can have different fixed nominal switching frequencies (e.g., 2.0 kHz, 2.5 kHz and 3.0 kHz) and can be operated at different displaced switching frequencies if this is appropriate. If the power converters use a pseudo-random series of switching frequencies, the individual switching frequencies can be defined so as to be displaced above and below the mean switching frequency in a manner that ensures that the mean switching frequency is equal to the nominal switching frequency. The pseudo-random series of switching frequencies can be defined so that the individual frequencies within the series are effective for equal time periods within a predetermined time period. Many individual switching frequencies can be effective within the execution period of the spectrum analysis process.

The DSP technique is in an embodiment adapted according to the switching frequency of each power converter in order to maximise its computational efficiency. In the case of the first and third switching frequency processes, the switching frequency of each power converter is set to, or maintained at, a constant value either continuously or for predetermined periods of time (e.g., when a switching frequency operation is applied). But in the case of the second switching frequency process, the switching frequency of each power converter is continuously variable. The sampling strategy of the DSP technique is in an embodiment synchronised to the switching frequency of the respective power converter and an integer number of substantially equal spaced samples can be taken during each cycle of switching frequency. It follows that the DSP sampling frequency may be fixed for the first and third switching frequency processes but may be variable for the second switching frequency process. The sampling and subsequent spectrum analysis is performed during an appropriate time window and the execution period of the spectrum analysis process will generally span at least several (e.g., at least four) cycles of the switching frequency.

The switching frequency operations of the third switching frequency process can be repeated any suitable number of times. In other words, a switching frequency operation can be applied to each power converter system more than once. The ground fault protection method according to the present invention can be carried out in parallel with a conventional ground fault protection process which is initiated when a ground fault is detected in the power distribution system and which can open protective circuit breakers/switchgear (typically for all of the power converter systems) in the event that a signal is not generated as a result of the spectrum analysis process within a predetermined period of time.

Each power converter system has its own dedicated controller. Each controller can include a PWM generator that controls the switching frequency of the power converter for the respective power converter system.

In a preferred arrangement, the controllers operate completely independently, i.e., there is no need for the controllers to communicate with each other.

In the case of the third switching frequency process, the switching frequency operations can be applied sequentially to the respective power converter systems on the basis of predetermined time delays. Each controller can be programmed or preset with its own unique time delay which represents the period of time between the switching frequency process being initiated or the ground fault being detected and the start of the switching frequency operation being applied to the respective power converter system. It will be understood that the first and second switching frequency processes are not 'initiated' in the same manner as the third switching frequency process because the power converters are operated continuously at the fixed switching frequencies, or in accordance with a pseudo-random series of different switching frequencies. But the third switching frequency process is not applied during normal operation of the power distribution system and must therefore be initiated when a ground fault is detected but the location of the ground fault has not been determined.

Each controller can independently initiate the switching frequency process when a ground fault is detected and then apply the switching frequency operation to its power converter system in such a way that the switching frequency operations for the power distribution system as a whole are applied sequentially and without overlap as described above. For example, if the power distribution system includes three power converter systems, the controller for the first power converter system can wait for a first period of time (first predetermined time delay) after initiating the switching frequency process before applying the switching operation to the power converter of the first power converter system, the controller for the second power converter system can wait for a second period of time (second predetermined time delay) after initiating the switching frequency process before applying the switching frequency operation to the power converter of the second power converter system, and the controller for the third power converter system can wait for a third period of time (third predetermined time delay) after initiating the switching frequency process before applying the switching frequency operation to the power converter of the third power converter system. Each switching frequency operation can be applied by the controller for a predetermined period of time and the first, second and third predetermined time delays can be selected so that the switching frequency operations are applied sequentially and without overlap.

Each controller can independently carry out its own fault detection process (e.g., using the spectrum analysis process applied to its respective power converter system) and use this to initiate the third switching frequency process. But in practice, the presence of a ground fault within the power distribution system can be detected by any suitable means. For example, by detecting a perturbation of a dc link mid-point voltage relative to ground, by detecting excessive zero sequence fault currents in the ac lines of an ac line filter or in the ac lines of an electrical machine or other load, or by detecting a common mode current in a dc link of a power converter system. Once an unspecified ground fault has been detected, the third switching frequency process can be initiated for each power converter system. If the controllers are operating correctly, it will be readily appreciated that they should all detect the presence of a ground fault within the power distribution system substantially simultaneously. As a result, the third switching frequency process should be initiated substantially simultaneously in all controllers. Small timing deviations in the initiation of the third switching frequency process between controllers can normally be accommodated by the gap between each switching frequency operation. But there may be limited situations where the deviations in the initiation of the third switching frequency process are such that there is an overlap between two or more switching frequency operations. Although such an overlap will degrade the ability of the spectrum analysis process to detect the location of a ground fault (e.g., because the power converters of two power converter systems will be operating at the displaced switching frequency at the same time) it is generally considered that any disadvantages arising from the independent operation of the controllers are significantly outweighed by the simplicity and robustness of the overall control process when there is no need for inter-controller communication. If a controller is faulty or does not initiate the third switching frequency process for any reason, the remaining controllers will still apply the switching frequency operation to their respective power converter system and attempt to identify the location of the ground fault. It would simply be the case that one of the switching frequency operations would be omitted from the overall switching frequency process. If the unspecified ground fault happens to be located in the power converter system with the faulty controller, the ground fault will normally be isolated by a conventional ground fault protective process when a signal is not generated by the spectrum analysis process within a predetermined period of time. It is also possible for two or more of the controllers to independently identify that the ground fault is located in their respective power converter systems. In this case, the two or more power converter systems can be isolated from the point of common coupling by opening the respective protective circuit breaker/switchgear and/or tripped. It will be understood that this is still a significant improvement on less selective conventional ground fault protective processes.

In some arrangements the controllers can communicate with each other using any suitable wired or wireless communication network. For example, although it is generally preferable that the switching frequency operations are carried out independently by each controller, one of the controllers might optionally transmit a signal (e.g., a reference signal or a command to initiate the third switching frequency process) to the remaining controllers in the power distribution system. The controller that transmits the signal might be the first controller to detect a ground fault. The controllers might also transmit signals to coordinate or synchronise their respective switching frequency operations or any other aspect of the fault location process. If one of the controllers identifies the location of the ground fault, it might optionally transmit a signal to halt the switching frequency process in the remaining controllers.

An external fault detection process can also be utilised which commands the controllers to initiate the third switching frequency process.

Each power converter can include just a single power converter module. The power converter module can be an active rectifier/inverter (or bridge) with a plurality of semiconductor switching devices controlled using a PWM strategy with a switching frequency. An example is a power converter of the PWM VSI type used as an active filter or a static VAR compensator electrically connected to a point of common coupling to which other PWM VSI type power converters are also connected. The power converter can be a matrix converter or PWM direct frequency converter.

Each power converter can include a first power converter module and a second power converter module. The first power converter module can be an active rectifier/inverter (e.g., a supply bridge) with a plurality of semiconductor switching devices controlled using a PWM strategy with a first fixed switching frequency (first switching frequency process) or a first pseudo-random series of switching frequencies (second switching frequency process) and the second power converter module can be an active receiver/inverter (e.g., a machine bridge, a load bridge or an output bridge as appropriate) with a plurality of semiconductor switching devices controlled using a PWM strategy with a second fixed switching frequency (first switching frequency process) or a second pseudo-random series of switching frequencies (second switching frequency process). An example is a power converter of the back to back PWM VSI type. The first and second power converter modules can optionally be connected by a dc link and can both be controlled by the controller for the respective power converter system.

In the case of the first switching frequency process, the first and second fixed switching frequencies can be the same or different.

In the case of the second switching frequency process, the first and second pseudo-random series of switching frequencies can be the same or different.

In the case of the third switching frequency process, the switching frequency operation is normally applied to the first and second power converter modules with each first power converter module being operated at a first nominal switching frequency and a first displaced switching frequency and each second power converter module being operated at a second nominal switching frequency and a second displaced switching frequency. The first and second nominal switching frequencies can be the same or different. The first and second displaced switching frequencies can be the same or different.

The switching frequency operation can be applied to the first and second power converter modules of each power converter system simultaneously. In other words, the first and second power converter modules of each power converter system can be operated at their respective displaced switching frequency at the same time, and can revert back to their respective nominal switching frequency at the same time when the switching frequency operation ends. For example, if the power distribution system includes three power converter systems, and each power converter includes a first power converter module and a second power converter module, the switching frequency operation can be applied simultaneously to the first and second power converter modules of the first power converter system, then to the first and second power converter modules of the second power converter system, and finally to the first and second power converter modules of the third power converter system. It will be readily appreciated that even in a situation where the switching frequency operation is applied simultaneously to the first and second power converter modules of a particular power converter system, it still follows that the switching frequency operation is being sequentially applied to each power converter system without overlap.

The switching frequency operation can be applied to the first and second power converter modules of each power converter system sequentially and without overlap. In other words, the first and second power converter modules of each power converter system can be operated at their respective displaced switching frequency at different times. For example, if the power distribution system includes three power converter systems, and each power converter includes a first power converter module and a second power converter module, the switching frequency operation can be applied to the first power converter module of the first power converter system, then to the second power converter module of the first power converter system, then to the first power converter module of the second power converter system, then to the second power converter module of the second power converter system, then to the first power converter module of the third power converter system, and finally to the second power converter module of the third power converter system. This means that only one power converter module will be operating at the displaced switching frequency at any particular time during the switching frequency process. The switching frequency operations can also be sequentially applied to the first and second power converter modules of the power converter systems in a different order if appropriate.

The first power converter module can be a passive rectifier (e.g., a diode or thyristor bridge) and in this case the switching frequency process is applied only to each second power converter module.

Each power converter can include two or more first power converter modules electrically connected in parallel to the point of common coupling (e.g., two or more supply bridges optionally of the PWM VSI type) as long as the zero sequence currents can be measured or derived for each of the supply ac lines. In such an arrangement, each first power converter module would have common mode voltages (e.g., CMV1a and CMV1b) equivalent to common mode voltage CMV1 shown in FIG. 1. Type 3 and type 2 ground faults may be detected by sensing zero sequence fault currents in the ac lines of one or more of the parallel-connected first power converter modules. A type 1 ground fault that affects one of the parallel-connected first power converter modules may be detected as described herein but this type of fault has an additional implication in that the ac lines that are electrically connected to each of the other power converters also experience much of the effect of the common mode voltage.

Each power converter can include two or more second power converter modules electrically connected in parallel to an electrical machine or other load (e.g., two or more machine or load bridges optionally of the PWM VSI type). In such an arrangement, each parallel-connected second power converter module would have common mode voltages (e.g., CMV2a and CMV2b) equivalent to common mode voltage CMV2 shown in FIG. 1. A type 3 ground fault that is present in ac lines of one of the parallel-connected second power converters causes spectral components of the respective common mode voltage (e.g., CMV2a) to be sensed as zero sequence currents in the supply ac lines primarily as a result of one or both of the first and second modes M1, M2 as shown in FIG. 3.

Any power converter module (and particularly those of the PWM VSI type) can have a two-level, three-level or multi-level topology and utilise any suitable semiconductor switching devices (e.g., IGBTs, GTOs, IGCTs, ETOs etc.) that are turned on and off by gate drive signals according to any suitable PWM control strategy. In an embodiment, the PWM strategy used to control the on/off operation of the semiconductor switching devices will generate strong zero sequence current signals at a particular switching frequency.

Each power converter system can be a variable speed drive (VSD) system or an application-specific system. Each power converter system can be electrically connected to an electrical machine (e.g., a motor) or to any suitable load and is typically used to interface the electrical machine or load to a distribution bus. Each power converter system can be an auxiliary power supply, e.g., including a supply bridge and an output bridge with a modulation frequency that is substantially constant.

A power distribution system can include a combination of different power converter systems if appropriate.

The power distribution system can be a marine power distribution and propulsion system.

Each power converter system can further include an ac line filter between the power converter and the point of common coupling. The ac line filter can include at least one filter reactor and optionally a filter capacitor connected to ground.

The zero sequence currents for the spectrum analysis process can be measured at, or derived from measurements taken at, any suitable location(s) within each power converter system. In the case where a power converter system includes an ac line filter with a filter capacitor connected to ground, preferred measurement locations are at the supply-side of the ac line filter (i.e., in the ac supply lines between the point of common coupling and the ac line filter), the converter-side of the ac line filter (i.e., in the ac supply lines between the ac line filter and the power converter and typically at the input of a power converter module of the PWM VSI type) and between the filter capacitor and ground. If a power converter includes a dc link between a first power converter module and a second power converter module, another measurement location is between a measuring capacitor that is connected to a centre tap of the dc link and ground. The measurements can be obtained using core balance current transformers (CBCTs), single phase current transformers or current sensors, for example. The measurements can also be obtained by current sensors that are actually embedded within the power converter, e.g., located in each converter leg of a power converter module. The output from current transformers or current sensors can be processed by the respective controller.

The present invention further provides a power distribution system comprising a plurality of power converter systems electrically connected to a point of common coupling, each power converter system including a power converter with a plurality of semiconductor switching devices controlled using a PWM strategy with a switching frequency and an ac line filter between the power converter and the point of common coupling that includes at least one filter reactor and optionally a filter capacitor connected to ground, wherein the power distribution system includes a controller for each power converter system, each controller being adapted to apply a spectrum analysis process to the respective power converter system that uses measured or derived zero sequence currents associated with the respective power converter system to determine the location of a ground fault within the power distribution system, and wherein the zero sequence currents for the spectrum analysis process are measured at, or derived from measurements taken at, at location between the ac line filter and the power converter (i.e., on the converter-side of the ac line filter in the ac supply lines between the ac line filter and the power converter and typically at the input of a power converter module of the PWM VSI type) or between the optional filter capacitor and ground.

The measurements can be obtained using CBCTs, single phase current transformers or current sensors, for example. The output from current transformers or current sensors can be processed by the respective controller.

Each controller can be adapted to apply a switching frequency process where the switching frequency of the power converter of at least one of the power converter systems is different from the switching frequency of the power converter of at least another one of the power converter systems during at least part of the time that the spectrum analysis process is applied.

Other features of the power distribution system are as described herein.

DETAILED DESCRIPTION

The propagation of zero sequence currents within a representative power distribution system 1' will now be described with reference to FIGS. 2 to 4.

Figure 1:
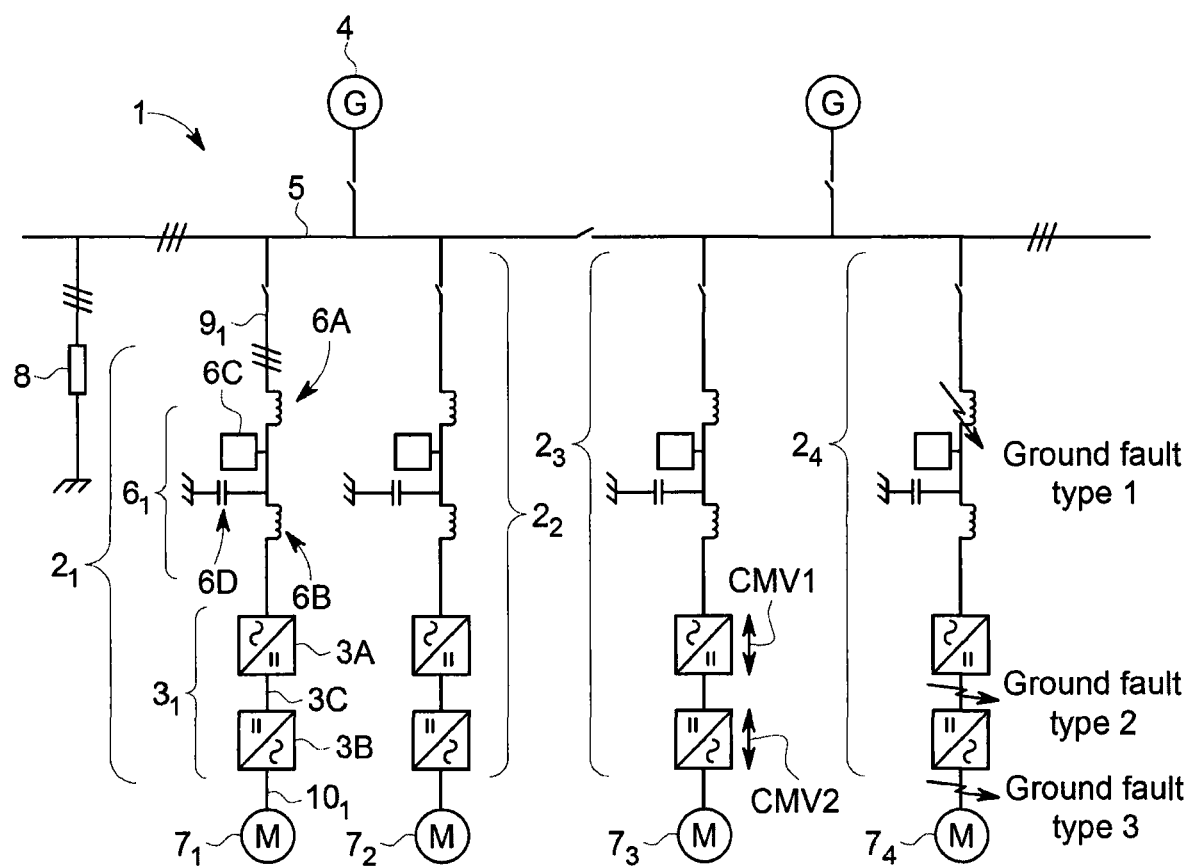
FIG. 1 shows a conventional transformerless, high resistance grounded, power distribution system.
Figure 2:
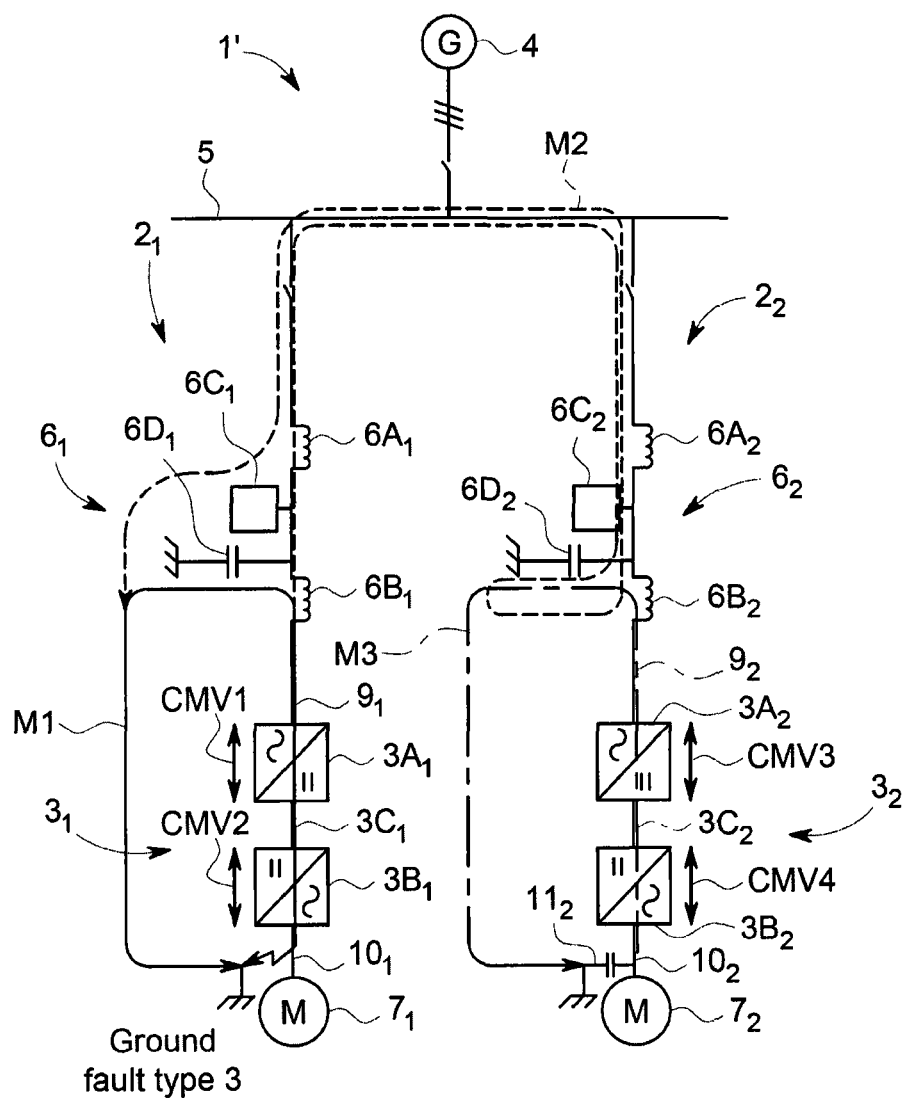
FIG. 2 shows a representative power distribution system.

The representative power distribution system 1' of FIG. 2 is similar to the power distribution system 1 shown in FIG. 1 and like components have been given the same reference numeral. The power distribution system 1' includes a distribution bus 5, which defines a point of common coupling between interconnected branches, and conventional circuit breaker/switchgear arrangements to allow connection of a generator 4, a first VSD system 2₁ and a second VSD system 2₂ to the distribution bus. The first VSD system 2₁ includes a first power converter 3₁ of the back to back PWM VSI type and a first ac line filter 6₁ and is used to interface a first electrical machine 7₁ (e.g., a motor) to the distribution bus 5. The second VSD system 2₂ includes a second power converter 3₂ of the back to back PWM VSI type and a second ac line filter 6₂ and is used to interface a second electrical machine 7₂ (e.g. a motor) to the distribution bus 5.

As is the case for all back to back PWM VSI type power converters, irrespective of voltage and power ratings, the first common mode voltage CMV1 of the supply bridge 3A₁ is continuously applied between the mid-point of the dc link 3C₁ and the neutral point of the ac lines 9₁ of the supply bridge, and the common mode voltage CMV2 of the machine bridge 3B₁ is continuously applied between the neutral point of the machine ac lines 10₁ and the mid-point of the dc link 3C₁. It therefore follows that the sum of common mode voltages CMV1 and CMV2 is continuously applied between the neutral point of the supply ac lines 9₁ and the neutral point of the machine ac lines 10₁. The magnitudes of the individual spectral components of the common mode voltages CMV1 and CMV2 are substantially pro rata with the dc link voltage and vary additionally according to the modulation depth of the supply bridge 3A₁ and the machine bridge 3B₁ respectively.

It will be readily appreciated that the fundamental component of the PWM switching frequency that is applicable to the supply bridge 3A₁ and the machine bridge 3B₁ is present in the common mode voltages CMV1 and CMV2, respectively, at all practically useful modulation depths. The voltage to ground at any point in the representative power distribution system 1' is governed by the relative levels of impedances to ground throughout the system—these impedances generally being capacitive, and ground faults typically having a dominantly low resistive impedance to ground and therefore defining the voltages to ground elsewhere in the system. These voltages to ground and impedances to ground define the currents that flow to ground, i.e., the zero sequence currents. It therefore follows that zero sequence currents are a maximum when a ground fault is present.

Type 3 Ground Fault:

Five significant modes of propagation of zero sequence fault currents within the power distribution system 1' exist when a type 3 ground fault is present. The current circulation paths of the first three modes are shown in FIG. 2 and the current circulation paths of all five modes are shown in single phase equivalent circuit form in FIG. 3.

It is assumed that a type 3 ground fault is present within the first VSD system 2₁. As a result of the presence of the ground fault on one of the machine ac lines 10₁, the common mode voltage CMV2 of the machine bridge 3B₁ is applied to the dc link 3C₁ and the common mode voltage CMV1 of the supply bridge 3A₁ is then superimposed upon CMV2 and the sum of CMV1 and CMV2 is impressed upon the supply ac lines 9₁. The EMC filter capacitor 6D₁ is connected to ground, hence a circulating current path is present and this is the first mode (labelled 'M1') of propagation of zero sequence fault currents. The magnitude of zero sequence fault currents is defined by common mode voltages CMV1 and CMV2, the zero sequence impedance of the second filter reactor 6B₁, the impedance of the EMC filter capacitor 6D₁, and stray interconnecting impedances (not shown). These stray impedances are minimised by design in the interest of EMC and will be described in more detail below with reference to the third and fourth modes.

The type 3 ground fault also causes the common mode voltage that is applied to the EMC filter capacitor 6D₁ to be increased. This voltage is also generally applied to equipment that is electrically connected to the point of common coupling but its amplitude is progressively and only slightly reduced as it propagates through the zero sequence impedance of the first filter reactor 6A₁, the zero sequence impedances of the distribution bus 5, the zero sequence impedance of the first filter reactor 6A₂ of the second ac line filter 6₂, and then to the EMC filter capacitor 6D₂ of the second ac line filter. The zero sequence fault currents then return to the site of the ground fault at the machine ac lines 10₁. This propagation is the second mode of propagation (labelled 'M2'). The spectra of zero sequence fault currents that flow in the EMC filter capacitor 6D₁, the first filter reactor 6A₁, the first filter reactor 6A₂ and the EMC filter capacitor 6D₂ are closely related in as much as they share the same source of common mode voltage, i.e., CMV1 and CMV2, and the degree of attenuation in the first filter reactor 6A₂ and the EMC filter capacitor 6D₂ of the second ac line filter 6₂, progressively increases in significance as harmonic order increases. It will be readily appreciated that the zero sequence fault currents that flow in the EMC filter capacitor 6D₁, the first filter reactor 6A₁, the first filter reactor 6A₂ and the EMC filter capacitor 6D₂ are phase shifted relative to one another according to their impedances.

The supply bridge 3A₂ and the machine bridge 3B₂ of the second VSD system 2₂ have respective common mode voltages CMV3 and CMV4 that are of similar form to the common mode voltages CMV1 and CMV2. In practice, they may be identical to the common mode voltages CMV1 and CMV2 when similar operating conditions are experienced by the first and second VSD systems 2₁, 2₂. A third mode of propagation of zero sequence fault currents (labelled 'M3') exists because the stator main wall insulation of the electrical machine 7₂ has a significant distributed capacitance 11₂ to ground and this provides a path between the machine ac lines 10₂ and local ground (i.e., the local point of connection in the ground network). The form of the third mode M3 is similar to that of the first mode M1 and the zero sequence fault currents are of a similar nature to those that flow in the first mode. In practice, the impedance of the distributed capacitance 11₂ to ground is generally greater than the impedance of the ground faults and the magnitude of current in the third mode M3 that flows in the EMC filter capacitor 6D₂ is generally less than the zero sequence fault currents of the first and second modes M1, M2. The zero sequence fault currents that flow in the third mode M3 commonly have similar frequency characteristics to those of the first and second modes M1, M2.

Figure 3:
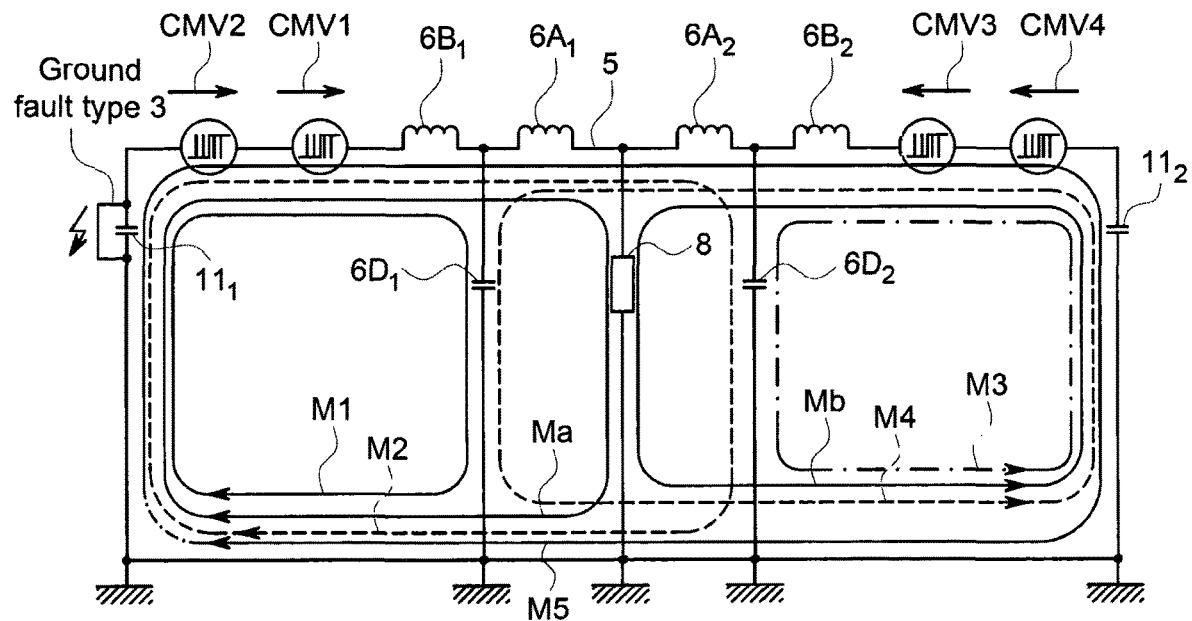
FIG. 3 is a single phase equivalent circuit showing the modes of propagation of zero sequence currents for a type 3 ground fault in the representative power distribution system of FIG. 2.

With reference to FIG. 3, common mode voltages CMV3 and CMV4 also cause a fourth mode (labelled 'M4') of propagation of zero sequence fault currents. The form of the fourth mode M4 is similar to that of the second mode M2 and the zero sequence fault currents are of a similar nature to those that flow in the second mode. In practice, the impedance of the distributed capacitance $11_2$ to ground is generally greater than the impedance of the ground faults and the magnitude of zero sequence fault currents in the fourth mode M4 that flows in the EMC filter capacitor $6D_1$ of the first ac line filter $6_1$ is generally less than the zero sequence fault currents of the first, second and third modes M1-M3. The zero sequence fault currents that flow in the fourth mode M4 commonly have similar frequency characteristics to those of the first and second modes M1, M2.

A fifth mode (labelled 'M5') also exists encompassing all four common mode voltages CMV1, CMV2, CMV3 and CMV4 and with currents flowing between the ground fault and distributed capacitance $11_2$ to ground. The magnitude of the zero sequence fault currents that flow in the fifth mode M5 are generally less than the zero sequence fault currents of the first, second, third and fourth modes M1-M4 and comprises the frequencies associated with the summation of all four common mode voltages. In general terms the magnitude of the various sequence fault current propagation modes is M1>M2>M3>M4>M5.

FIG. 3 also shows the current circulation paths through the high resistance grounding resistor 8. The high impedance of this resistor causes currents that pass through this resistor to have a relatively small magnitude. The modes that flow in the high resistance grounding resistor 8 are labelled 'Ma' and 'Mb'.

Figure 4:
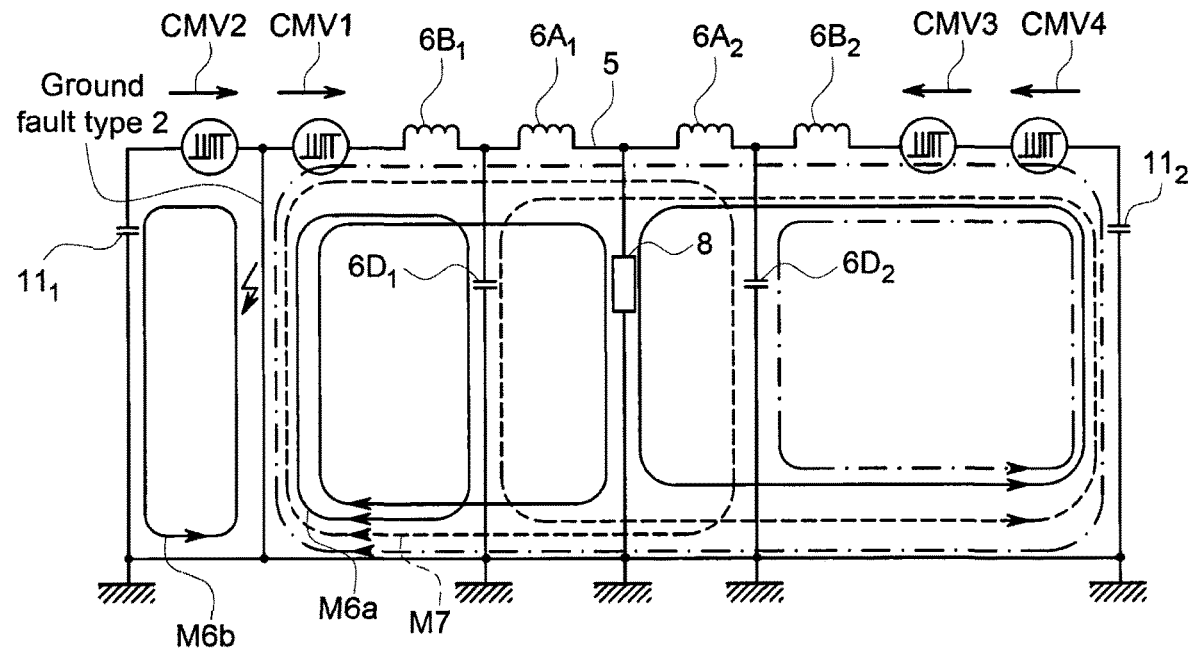
FIG. 4 is a single phase equivalent circuit showing the modes of propagation of zero sequence currents for a type 2 ground fault in the representative power distribution system of FIG. 2.

Type 2 Ground Fault:

When a type 2 ground fault is present, a sixth mode of propagation of zero sequence fault currents comprising two circulating current paths exists and these are labelled 'M6a' and 'M6b' in single phase equivalent circuit form in FIG. 4.

The first circulating current path of the sixth mode M6a is similar to the first mode M1 of propagation of zero sequence fault currents, the difference being that the common mode voltage CMV2 is no longer summated with the common mode voltage CMV1 because the ground reference point is now in either the positive or negative terminal of the dc link $3C_1$ according to the location of the ground fault. This ground reference point is also applicable to the common mode voltage CMV2 of the machine bridge $3B_1$ and this causes the second circulating current path of the sixth mode M6b to exist. As is the case for the relationship between the first and second modes of propagation of zero sequence fault currents, the first circulating current path of the sixth mode of propagation of zero sequence fault currents is associated with a seventh mode of propagation of zero sequence fault currents (labelled 'M7'). The seventh mode M7 is similar to the second mode M2 but in this case the mode of propagation of zero sequence fault currents is not excited by the common mode voltage CMV2 of the machine bridge $3B_1$.

Eighth and ninth modes of propagation of zero sequence fault currents (labelled 'M8' and 'M9') are equivalent to the third and fourth modes M3, M4. A tenth mode of propagation of zero sequence fault currents (labelled 'M10') is similar to the fifth mode M5. However, it will be readily appreciated that the eighth, ninth and tenth modes are not exited by the common mode voltage CMV2 of the machine bridge $3B_1$.

Type 1 Ground Fault:

A single phase equivalent circuit showing the modes of propagation during a type 1 ground fault has not been included because the propagation between VSD systems is greatly reduced as a result of the voltage to ground of the distribution bus being set by the ground fault.

When a type 1 ground fault is present, the propagation of zero sequence fault currents in the distribution bus 5 is dominated by a first current component that is defined by the fundamental component of the ac power distribution phase voltage and the ohmic value of the high resistance grounding resistor 8. The second mode M2 of propagation of zero sequence fault currents is also effective and these respective currents are superimposed upon the first current component. When a conventional high resistance ground current detection process is employed, i.e., a detection process that is generally responsive to the fundamental component of the distribution voltage frequency, this detection process is generally rendered non-responsive to the circulating currents that are defined by the second mode M2 of propagation of zero sequence fault currents as a result of careful selection of the high resistance grounding resistor 8 and the capacitance to ground of the EMC filter capacitor 6D of the ac line filter 6. The EMC filter capacitance is defined with the specific objective of reducing the high frequency spectral content of common mode voltage that is experienced throughout the distribution bus 5.

Practical power distribution systems typically have more than one generator and more than two VSD systems. The VSD systems are generally identical or at least have identical modular power electronics and PWM control strategies for reasons of system simplification, economy and reduced spares holding. The above description of the nature of the zero sequence fault current propagation modes is adequate for the proper understanding of the present invention, but it will be readily understood that many more propagation modes exist in practice.

Figure 5:
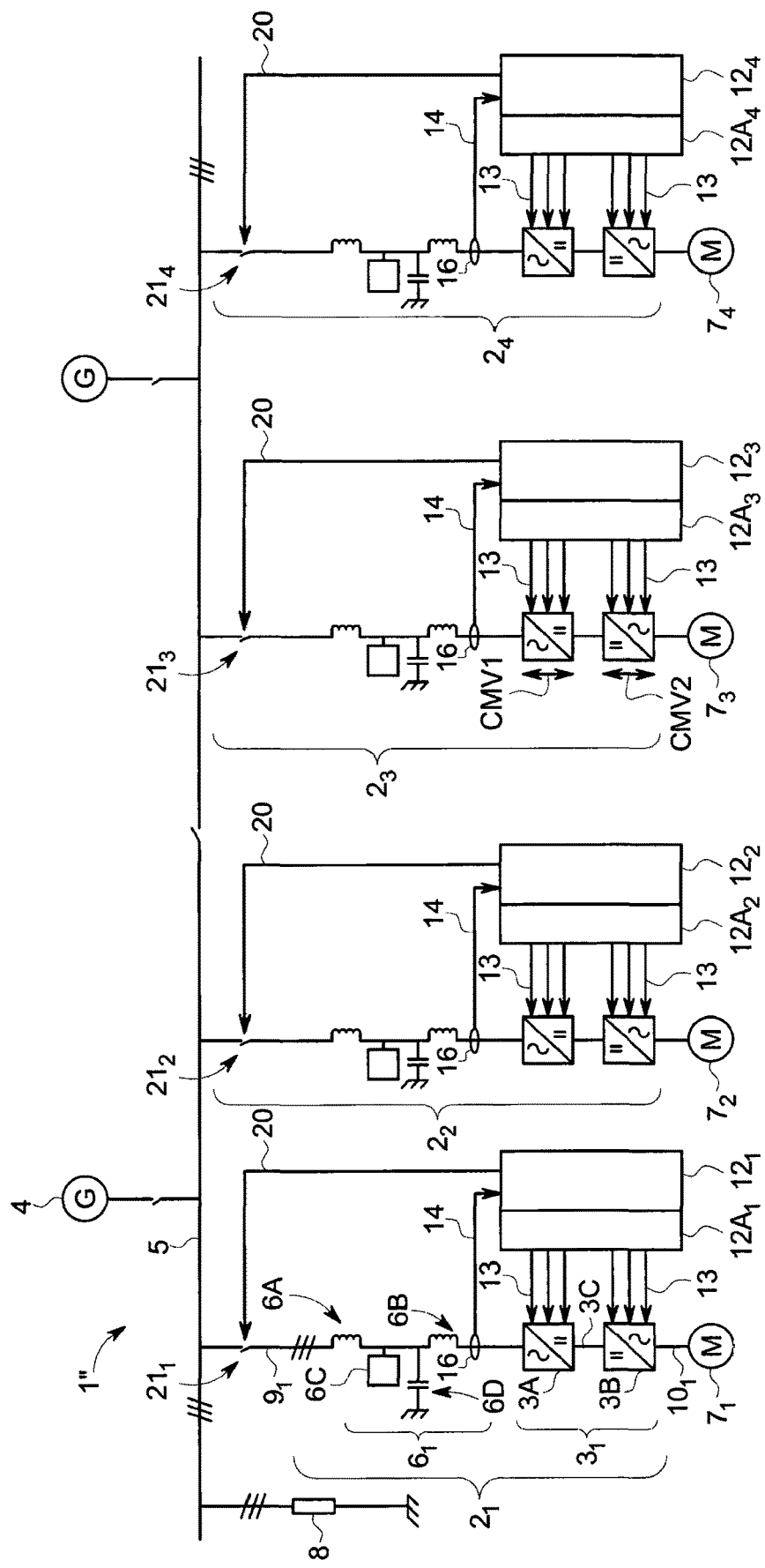
FIG. 5 shows a transformerless, high resistance grounded power distribution system according to the present invention.

FIG. 5 shows a transformerless, high resistance grounded, power distribution system 1" that is similar to the system shown in FIG. 1 and like components have been given the same reference sign. The power distribution system 1" includes four variable speed drive (VSD) systems $2_1$-$2_4$. Each VSD system 2 includes a power converter 3 of the back to back PWM VSI type and an ac line filter 6. Each VSD system 2 interfaces an electrical machine (e.g., a motor) 7 to a distribution bus 5 which defines a point of common coupling.

Each power converter 3 includes a supply bridge 3A having ac terminals electrically connected to the distribution bus 5 and a machine bridge 3B electrically connected to the machine 7. The dc terminals of each supply bridge 3A are electrically connected to the dc terminals of the machine bridge 3B by a dc link 3C. The supply bridge 3A of each power converter 3 is electrically connected to the distribution bus 5 by the ac line filter 6. The supply bridge 3A and the machine bridge 3B are of the PWM VSI type with a plurality of semiconductor switching devices fully controlled using a PWM control strategy. In practical power distribution systems the VSD systems $2_1$-$2_4$ are generally identical or at least have identical modular power electronics and PWM control strategies for reasons of system simplification, economy and reduced spares holding. The supply bridge 3A and the machine bridge 3B of each power converter 3 are therefore normally controlled to have the same switching frequency. The following discussion will generally refer to the switching frequency of the power converter 3 on the basis that this is the same as the switching frequency of both the supply bridge 3A and the machine bridge 3B. But it is also possible for the supply bridge 3A and the machine bridge 3B of each power converter 3 to be controlled to have different switching frequencies.

Each ac line filter 6 includes a first filter reactor 6A, a second filter reactor 6B and additional filter component 6C. Each ac line filter 6 also includes an EMC filter capacitor 6D that is connected to ground.

Each VSD system 2 has a dedicated controller 12. The controllers $12_1$-$12_4$ are completely independent from each other (i.e., there is no inter-controller communication) and each controller is adapted to carry out spectrum analysis and switching frequency processes as described in more detail below. Each controller 12 incorporates a conventional PWM generator 12A which derives gate drive signals 13 for controlling the on/off operation of the semiconductor switching devices of the respective power converter 3 according to the PWM control strategy. The switching frequency of the PWM control strategy is determined by each PWM generator 12A and is used as an input to the spectrum analysis process that is applied by the respective controller 12.

Figure 6:
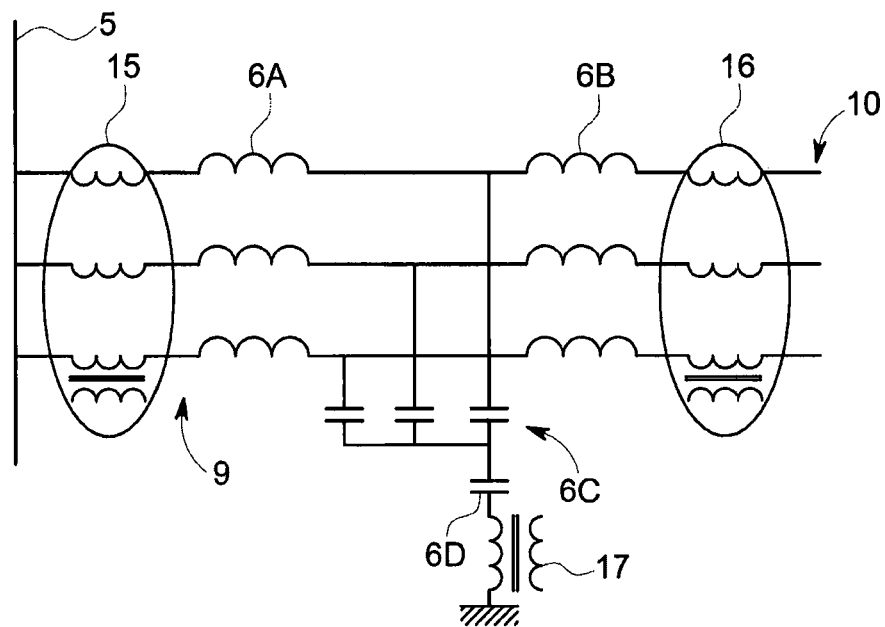
FIGS. 6 and 7 show possible locations within the power distribution system of FIG. 5 where zero sequence currents can be measured.
Figure 7:
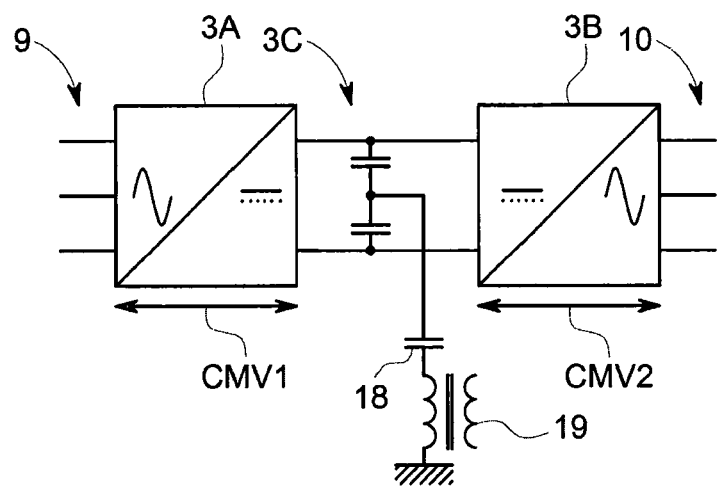

Each controller 12 also receives zero sequence current inputs 14 for its respective VSD system 2. The zero sequence currents can be measured at the supply ac lines 9 or at the ground connection to the EMC filter capacitor 6D as shown in FIG. 6. More particularly, FIG. 6 shows a first core balanced current transformer (CBCT) 15 positioned in the supply ac lines 9 between the distribution bus 5 and the first filter reactor 6A and a second CBCT 16 positioned in the supply ac lines between the second filter reactor 6B and the supply bridge 3A. The first CBCT 15 is able to measure zero sequence currents that propagate from the VSD system 2 into a ground fault in the distribution bus 5 of the power distribution system 1". The ac line currents are effectively summated within three phases and either CBCTs or three-phase current transformers (CTs) with summated outputs may be employed. Each VSD system 2 may inherently be fitted with three ac line current sensors (not shown) in the supply ac lines 9 so that zero sequence currents are derived by summating the three output signals from these current sensors within the associated controller 12. FIG. 6 also shows a CBCT 17 between the EMC filter capacitor 6D and ground. The CBCT 17 measures zero sequence currents that are fed into the EMC filter capacitor 6D by the additional filter component 6C, e.g., a differential mode filter capacitor array. FIG. 7 shows an alternative arrangement of deriving zero sequence currents. A measuring capacitor 18 is connected in series with a CT 19 between a centre tap of the dc link 3C and ground. It is commonplace for the dc link 3C of a back to back PWM VSI type power converter to incorporate centre tapped dc link capacitors but two equal value capacitors can be also provided for this purpose. The CT 19 will measure common mode voltage ripple in the dc link 3C that is a consequence of zero sequence currents in the supply bridge and machine ac lines. In particular, the common mode voltage (or CMV1) of the supply bridge 3A is impressed between the neutral of the supply ac lines 9 and the centre tap of the dc link 3C and the common mode voltage (or CMV2) of the machine bridge 3B is impressed between the neutral of the machine ac lines 10 and the centre tap of the dc link.

The presence of a type 3 ground fault at the machine ac lines 10 causes the fundamental phase voltage of the machine 7 to be summated with the PWM related common mode voltage CMV2 of the machine bridge 3C. CMV2 is of the form n·Fm where n is an integer and Fm is the fundamental component of the switching frequency of the machine bridge 3B. The amplitudes of common mode voltage CMV2 spectral components reduce as harmonic order n is increased. The fundamental voltage and frequency are lowest and common mode voltage CMV2 is greatest when the machine is at low speed. Common mode voltage CMV2 is dominant at low speeds and the spectrum analysis process must be able to rapidly detect the fundamental component or an integer or non-integer harmonic component of the switching frequency of the machine bridge 3B. Machine stator ground faults can occur in intermediate sites between ac line terminals and this reduces the fundamental voltage amplitude relative to the terminal voltages. The fundamental voltage and frequency are greatest and the common mode voltage CMV2 is lowest when the machine is at high speed. Despite the reduction in the common mode voltage CMV2 when the machine is at high speeds, this component of common mode voltage is sufficient for the corresponding component of measured current to be detectable.

Common mode voltage CMV1 of the supply bridge 3A is of the form m·Fs where m is an integer and Fs is the fundamental component of the switching frequency of the supply bridge. Common mode voltage CMV1 is typically variable over a small range in as much as dc link voltage and supply distribution voltage are well defined. The spectrum analysis process must be able to rapidly detect the fundamental component or an integer or non-integer harmonic component of the switching frequency of the supply bridge 3A. Common mode voltage CMV1 is summated with the dc link mid-point voltage and the summated voltages are impressed upon the supply ac lines 9. These summated zero sequence voltages cause corresponding zero sequence fault currents to flow in the first filter reactor 6A and thereby into the EMC filter capacitor 6D and the ac lines that are electrically connected to the second filter reactor 6B of the respective ac line filter 6. The zero sequence current frequency spectrum that flows in the EMC filter capacitor 6D and the CBCT 16 at the input to the supply bridge 3A can be analysed in order to identify a type 3 ground fault.

The presence of a type 2 ground fault on either the positive terminal or the negative terminal of the dc link 3C causes a dc offset voltage of +Vdc/2 or −Vdc/2 to be summated with the PWM related common mode voltage CMV1 of the supply bridge 3A. Common mode voltage CMV1 is of the form n·Fs. The amplitudes of common mode voltage CMV1 spectral components reduce as harmonic order n is increased. Common mode voltage CMV1 and the dc offset voltage vary over a small range and are both zero sequence voltage components. These summated zero sequence voltages cause corresponding zero sequence fault currents to flow in the supply ac lines 9 and in the EMC filter capacitor 6D of the respective ac line filter 6. The zero sequence fault current frequency spectrum that flows in the EMC filter capacitor 6D and the CBCT 16 at the input to the supply bridge 3A can be analysed in order to identify a type 2 ground fault.

The presence of a type 1 ground fault at the supply ac lines 9 causes the fundamental component of the distribution voltage to be applied as a common mode voltage to the supply ac lines. It also causes a distribution frequency current to flow in the high resistance grounding resistor 8, in the supply ac lines 9 to the first filter reactor 6A and in the EMC filter capacitor 6D of the respective ac line filter 6. The fundamental component of the distribution voltage frequency (Fd) is normally 60 Hz and occasionally 50 Hz. Because the zero sequence fault currents have a low frequency, they are distributed primarily to the high resistance grounding resistor 8. The spectrum analysis process should be able to detect these fault currents in one cycle, e.g. 16.7 ms or 20 ms. A low pass filter may be used to isolate the distribution fundamental frequency component of current from the PWM current spectrum. Since voltages to ground throughout the power distribution system are now defined by the ground fault, and as a result of the PWM differential mode voltages between supply ac lines 9, zero sequence fault currents flow in the grounding resistor 8, the supply bridge ac lines to the first filter reactor 6A and in the EMC filter capacitor 6D of the respective ac line filter 6.

Spectrum Analysis Process

Each controller 12 continuously carries out a spectrum analysis process that can be used for fault detection and fault location.

Each controller 12 uses an appropriate digital signal processing (DSP) technique such as synchronous Discrete Fourier Transform (DFT) to derive a series of amplitudes of the frequency component within the zero sequence current frequency spectrum that correspond to the fundamental component of the switching frequency of the power converter 3. In other words each controller 12 derives a series of first amplitudes A1(Fc) where Fc is the fundamental component of the switching frequency of the power converter 3. Fc=Fs=Fm where Fs is the fundamental component of the switching frequency of the supply bridge 3A and Fm is the fundamental component of the switching frequency of the machine bridge 3B as noted above. Each controller 12 can additionally derive a series of second amplitudes A2(Fd) and third amplitudes A3(F1) where F1 is the fundamental component of the machine stator (or load) voltage frequency.

The first amplitudes A1(Fc) are compared against predetermined thresholds for fault detection and fault location. For example, A1(Fc) can be compared against a first threshold D1(Fc) for fault detection and a first threshold L1(Fc) for fault location. When the power distribution system 1" is operating normally, the first amplitudes A1(Fc) should be below the first fault detection threshold D1(Fc) because there is no ground fault in the power distribution system. But in the event of a ground fault occurring in the power distribution system 1", the ground fault will propagate through the appropriate modes described above, and the first amplitudes A1(Fc) should exceed the first fault detection threshold D1(Fc), i.e., A1(Fc)>D1(Fc).

When a first amplitude A1(Fc) exceeds the first fault detection threshold D1(Fc), an internal signal is generated by the controller 12 and this can be used to initiate a switching frequency process where a switching frequency operation is sequentially applied to each VSD system $2_1$-$2_4$ without overlap as described in more detail below. It must be emphasised that each controller 12 will carry out the spectrum analysis process completely independently and in parallel. But if all of the controllers 12 are operating normally, they should all detect the presence of an unspecified ground fault at substantially the same time. This means that such a switching frequency process will be initiated in parallel in each controller 12 at substantially the same time. Small timing deviations in the initiation of the switching frequency process can normally be accommodated by a gap between each switching frequency operation as will be described in more detail below with reference to FIGS. 8A and 8B.

The switching frequency process can also be initiated by other, conventional, ground fault detecting means. For example, an unspecified ground fault can be detected based on:

a perturbation of the mid-point voltage of the dc link 3C relative to ground—this perturbation being an ac voltage at the fundamental component or an integer or non-integer harmonic of the distribution voltage frequency, e.g., 50 or 60 Hz a dc offset of ±Vdc/2 an ac voltage at the fundamental component or an integer or non-integer harmonic of the machine stator frequency excessive zero sequence fault currents in the supply ac lines or in the machine ac lines a common mode current in the dc link 3C

If the ground fault is not located in the particular VSD system, the first amplitudes A1(Fc) should be below the first fault location threshold L1(Fc). But if a ground fault is located in the particular VSD system, the first amplitudes A1(Fc) should exceed the first fault location threshold L1(Fc), i.e., A1(Fc)>L1(Fc). If a first amplitude A1(Fc) exceeds the first fault location threshold L1(Fc), a signal 20 is generated by the controller 12 and used to open a protective circuit breaker $2_1$ for the associated VSD system 2 and/or to trip the VSD system.

The second and third amplitudes A2(Fd) and A3(F1) can optionally be used to determine the precise location of the ground fault within the faulty VSD system. For example, the second and third amplitudes A2(Fd) and A3(F1) can be compared against second and third fault location thresholds L2(Fd) and L3(F1), respectively.

It is generally preferred that conventional ground fault protection equipment (not shown) is installed to protect the power distribution system 1" and this can be used to initiate circuit breaker/switchgear tripping if the location of the unspecified ground fault is not identified by the spectrum analysis process within a predetermined period of time, for example.

Switching Frequency Processes

Each controller 12 carries out a switching frequency process to improve the signal to noise ratio for the benefit of the spectrum analysis process, particularly for fault location.

In a first switching frequency process, the supply bridge $3A_1$ and the machine bridge $3B_1$ of the first power converter $3_1$ are operated continuously at a first switching frequency, (i.e., $Fc_1=Fs_1=Fm_1=1.5$ kHz), the supply bridge $3A_2$ and the machine bridge $3B_2$ of the second power converter $3_2$ are operated continuously at a second switching frequency (i.e., $Fc_2=Fs_2=Fm_2=2.0$ kHz), the supply bridge $3A_3$ and the machine bridge $3B_3$ of the third power converter $3_3$ are operated continuously at a third switching frequency, (i.e., $Fc_3=Fs_3=Fm_3=2.5$ kHz), and the supply bridge $3A_4$ and the machine bridge $3B_4$ of the fourth power converter $3_4$ are operated continuously at a fourth switching frequency (i.e., $Fc_4=Fs_4=Fm_4=3.0$ kHz).

The switching frequencies are controlled by the PWM generator 12A of each controller 12 and are provided as inputs to the spectrum analysis process that is applied by each controller to its respective power converter 3. For example, if $Fc_1=Fs_1=Fm_1=1.5$ kHz for the first VSD system $2_1$, the spectrum analysis process carried out by the first controller $12_1$ will derive a series of first amplitudes $A1_1(Fc_1)$ for the fundamental component of the switching frequency of the first power converter $3_1$. Corresponding first amplitudes $A1_2(Fc_2)$, $A1_3(Fc_3)$ and $A1_4(Fc_4)$ can be derived by the second, third and fourth controllers $12_2$, $12_3$ and $12_4$ for the fundamental component of the switching frequency of the second, third and fourth power converters $3_2$, $3_3$ and $3_4$ in a similar manner. The first, second, third and fourth controllers $12_1$-$12_4$ can each additionally derive a series of second amplitudes $A2_1(Fd_1)$-$A2_4(Fd_4)$ and third amplitudes $A3_1(F1_1)$-$A3_4(F1_4)$.

The first amplitudes $A1_1(Fc_1)$, $A1_2(Fc_2)$, $A1_3(Fc_3)$ and $A1_4(Fc_4)$ can be compared against first fault detection thresholds $D1_1(Fc_1)$, $D1_2(Fc_2)$, $D1_3(Fc_3)$ and $D1_4(Fc_4)$ and first fault location thresholds $L1_1(Fc_1)$, $L1_2(Fc_2)$, $L1_3(Fc_3)$ and $L1_4(Fc_4)$, respectively, by the first, second, third and fourth controllers $12_1$-$12_4$ for fault detection and fault location purposes. In the event of a ground fault occurring in the power distribution system 1", the ground fault will propagate through the appropriate modes described above and should be detected because $A1_1(Fc_1)$>$D1_1(Fc_1)$ for the first VSD system $2_1$, $A1_2(Fc_2)$>$D1_2(Fc_2)$ for the second VSD system $2_2$, $A1_3(Fc_3)$>$D1_3(Fc_3)$ for the third VSD system $2_3$ and $A1_4(Fc_4)$>$D1_4(Fc_4)$ for the fourth VSD system $2_4$. The detection of a ground fault at an unspecified location within the power distribution system 1" can be used to initiate a conventional ground fault protection process, for example.

If the ground fault is located in the second VSD system $2_2$, the first amplitudes $A1_2(Fc_2)$ should exceed the first fault location threshold $L1_2(Fc_2)$, i.e., $A1_2(Fc_2)$>$L1_2(Fc_2)$. But the first amplitudes for the first, third and fourth VSD systems $2_1$, $2_3$ and $2_4$ should not exceed the respective first fault location thresholds, i.e., $A1_1(Fc_1)$<$L1_1(Fc_1)$, $A1_3(Fc_3)$<$L1_3(Fc_3)$ and $A1_4(Fc_4)$<$L1_4(Fc_4)$.

If a first amplitude $A1_2(Fc_2)$ for the second VSD system $2_2$ exceeds the first fault location threshold $L1_2(Fc_2)$ a signal 20 is generated by the second controller $12_2$ and used to open a protective circuit breaker 212 for the second VSD system and/or to trip the second VSD system. The second and third amplitudes $A2_2(Fd_2)$ and $A3_2(F1_3)$ derived by the second controller $12_2$ can optionally be used to determine the precise location of the ground fault within the second VSD system $2_2$.

In a second switching frequency process the derived amplitudes, fault detection thresholds and fault location thresholds are related to the pseudo-random series of switching frequencies. In other words, the switching frequency of the supply bridge 3A and the machine bridge 3B of each power converter 3 is continuously variable within a range of switching frequencies. The supply bridge $3A_1$ and the machine bridge $3B_1$ of the first power converter $3_1$ are operated continuously with a first pseudo-random series of variable switching frequencies within a range of switching frequencies (i.e., 2.0 kHz<$(Fc_1)_1^k$=$(Fs_1)_1^k$=$(Fm_1)_1^k$<3.0 kHz), the supply bridge $3A_2$ and the machine bridge $3B_2$ of the second power converter $3_2$ are operated continuously with a second pseudo-random series of variable switching frequencies within a range of switching frequencies, (i.e., 2.0 kHz<$(Fc_2)_1^k$=$(Fs_2)_1^k$=$(Fm_2)_1^k$<3.0 kHz), the supply bridge $3A_3$ and the machine bridge $3B_3$ of the third power converter $3_3$ are operated continuously with a third pseudo-random series of variable switching frequencies within a range of switching frequencies (i.e., 2.0 kHz<$(Fc_3)_1^k$=$(Fs_3)_1^k$=$(Fm_3)_1^k$<3.0 kHz), and the supply bridge $3A_4$ and the machine bridge $3B_4$ of the fourth power converter $3_4$ are operated continuously with a fourth pseudo-random series of variable switching frequencies within a range of switching frequencies, (i.e., 2.0 kHz<$(Fc_4)_1^k$=$(Fs_4)_1^k$=$(Fm_4)_1^k$<3.0 kHz).

The switching frequencies are controlled by the PWM generator 12A of each controller 12 and are provided as inputs to the spectrum analysis process that is applied by each controller to its respective power converter 3. For example, the spectrum analysis process carried out by the first controller $12_1$ will derive a series of first aggregated amplitudes $A1_1(Fc_1)$ for the first power converter $3_1$. (It will be readily appreciated that in the second switching frequency operation the switching frequencies are a pseudo-random series and not a fixed value. It is therefore appropriate to think of the derived first amplitudes as being aggregate values where the aggregation is performed over an appropriate time window.) Corresponding first aggregated amplitudes $A1_2(Fc_2)$, $A1_3(Fc_3)$ and $A1_4(Fc_4)$ can be derived by the second, third and fourth controllers $12_2$, $12_3$ and $12_4$ for the fundamental component of the switching frequency of the second, third and fourth power converters $3_2$, $3_3$ and $3_4$ in a similar manner. The first, second, third and fourth controllers $12_1$-$12_4$ can each additionally derive a series of second aggregated amplitudes $A2_1(Fd_1)$-$A2_4(Fd_4)$ and third aggregated amplitudes $A3_1(F1_1)$-$A3_4(F1_4)$.

The first aggregated amplitudes $A1_1(Fc_1)$, $A1_2(Fc_2)$, $A1_3(Fc_3)$ and $A1_4(Fc_4)$ can be compared against first fault detection thresholds $D1_1(Fc_1)$, $D1_2(Fc_2)$, $D1_3(Fc_3)$ and $D1_4(Fc_4)$ and first fault location thresholds $L1_1(Fc_1)$, $L1_2(Fc_2)$, $L1_3(Fc_3)$ and $L1_4(Fc_4)$, respectively, by the first, second, third and fourth controllers $12_1$-$12_4$ for fault detection and fault location purposes. In the event of a ground fault occurring in the power distribution system 1", the ground fault will propagate through the appropriate modes described above and should be detected because $A1_1(Fc_1)$>$D1_1(Fc_1)$ for the first VSD system $2_1$, $A1_2(Fc_2)$>$D1_2(Fc_2)$ for the second VSD system $2_2$, $A1_3(Fc_3)$>$D1_3(Fc_3)$ for the third VSD system $2_3$ and $A1_4(Fc_4)$>$D1_4(Fc_4)$ for the fourth VSD system $2_4$. The detection of a ground fault at an unspecified location within the power distribution system 1" can be used to initiate a conventional ground fault protection process, for example.

If the ground fault is located in the second VSD system $2_2$, the first aggregated amplitudes $A1_2(Fc_2)$ should exceed the first fault location threshold $L1_2(Fc_2)$, i.e., $A1_2(Fc_2)$>$L1_2(Fc_2)$. But the first aggregate amplitudes for the first, third and fourth VSD systems $2_1$, $2_3$ and $2_4$ should not exceed the first fault location thresholds, i.e., $A1_1(Fc_1)$<$L1_1(Fc_1)$, $A1_3(Fc_3)$<$L1_3(Fc_3)$ and $A1_4(Fc_4)$<$L1_4(Fc_4)$.

If a first aggregated amplitude $A1_2(Fc_2)$ for the second VSD system $2_2$ exceeds the first fault location threshold $L1_2(Fc_2)$ a signal 20 is generated by the second controller $12_2$ and used to open a protective circuit breaker 212 for the second VSD system and/or to trip the second VSD system. The second and third amplitudes $A2_2(Fd_2)$ and $A3_2(F12)$ derived by the second controller $12_2$ can optionally be used to determine the precise location of the ground fault within the second VSD system $2_2$.

In a third switching frequency process, the supply bridge $3A_1$-$3A_4$ and the machine bridge $3B_1$-$3B_4$ of the first, second, third and fourth power converters $3_1$-$3_4$ are operated at the same nominal switching frequency, (i.e., $Fc_{1-4}$=$Fs_{1-4}$=$Fm_{1-4}$=2.5 kHz).

The switching frequencies are controlled by the PWM generator 12A of each controller 12 and are provided as inputs to the spectrum analysis process that is applied by each controller to its respective power converter 3.

The third switching frequency process can be initiated by any suitable means. But in one arrangement the switching frequency process is initiated by the spectrum analysis process that is carried out by the first, second, third and fourth controllers $12_1$-$12_4$. For example, the first controller $12_1$ will derive a series of first amplitudes $A1_1(Fc_1)$ for the fundamental component of the nominal switching frequency of the first power converter $3_1$. Corresponding first amplitudes $A1_2(Fc_2)$, $A1_3(Fc_3)$ and $A1_4(Fc_4)$ can be derived by the second, third and fourth controllers $12_2$, $12_3$ and $12_4$ for the fundamental component of the nominal switching frequency of the second, third and fourth power converters $3_2$, $3_3$ and $3_4$ in a similar manner. The first amplitudes $A1_1(Fc_1)$, $A1_2(Fc_2)$, $A1_3(Fc_3)$ and $A1_4(Fc_4)$ can be compared against first fault detection thresholds $D1_1(Fc_1)$, $D1_2(Fc_2)$, $D1_3(Fc_3)$ and $D1_4(Fc_4)$, respectively, by the first, second, third and fourth controllers $12_1$-$12_4$ for fault detection purposes. In the event of a ground fault occurring in the power distribution system 1", the ground fault will propagate through the appropriate modes described above and should be detected because $A1_1(Fc_1)$>$D1_1(Fc_1)$ for the first VSD system $2_1$, $A1_2(Fc_2)$>$D1_2(Fc_2)$ for the second VSD system $2_2$, $A1_3(Fc_3)$>$D1_3(Fc_3)$ for the third VSD system $2_3$ and $A1_4(Fc_4)$>$D1_4(Fc_4)$ for the fourth VSD system $2_4$. The detection of a ground fault at an unspecified location within the power distribution system 1" can be used to initiate the switching frequency process in each controller $12_1$-$12_4$.

In some situations, the first amplitudes $A1_1(Fc_1)$, $A1_2(Fc_2)$, $A1_3(Fc_3)$ and $A1_4(Fc_4)$ can be compared against first fault location thresholds $L1_1(Fc_1)$, $L1_2(Fc_2)$, $L1_3(Fc_3)$ and $L1_4(Fc_4)$, respectively, by the first, second, third and fourth controllers $12_1$-$12_4$ for fault location even before the third switching frequency process is initiated. For example, if the ground fault is located in the third VSD system $2_3$, a first amplitude might exceed the first fault location threshold at the fundamental component of the nominal switching frequency, i.e., $A1_3(Fc_3)$>$L1_3(Fc_3)$ before the switching frequency process begins. In this case a signal 20 is generated by the third controller $12_3$ and used to open a protective circuit breaker $21_3$ for the third VSD system $3_2$ and/or to trip the third VSD system without the need to initiate the switching frequency process.

When the third switching frequency process is initiated in a particular controller 12, it will wait for a predetermined period of time before applying a switching frequency operation to its associated power converter 3. In this example, it is assumed that the switching frequency operation is applied simultaneously to both the supply bridge $3A_1$-$3A_4$ and the machine bridge $3B_1$-$3B_4$ of each power converter $3_1$-$3_4$. The predetermined period of time for each controller $12_1$-$12_4$ is selected such that the switching frequency operations are applied to the VSD systems $2_1$-$2_4$ of the power distribution system 1" in a non-overlapping manner.

When a switching frequency operation is applied to a particular power converter 3, the supply bridge 3A and the machine bridge 3B will be operated at a displaced switching frequency (e.g., 2.0 kHz) for a predetermined period of time before reverting back to the nominal switching frequency of 2.5 kHz. The switching frequency of the supply bridge 3A and the machine bridge 3B is varied between the nominal switching frequency and the displaced switching frequency by the PWM generator 12A of each controller 12.

Figure 8A:
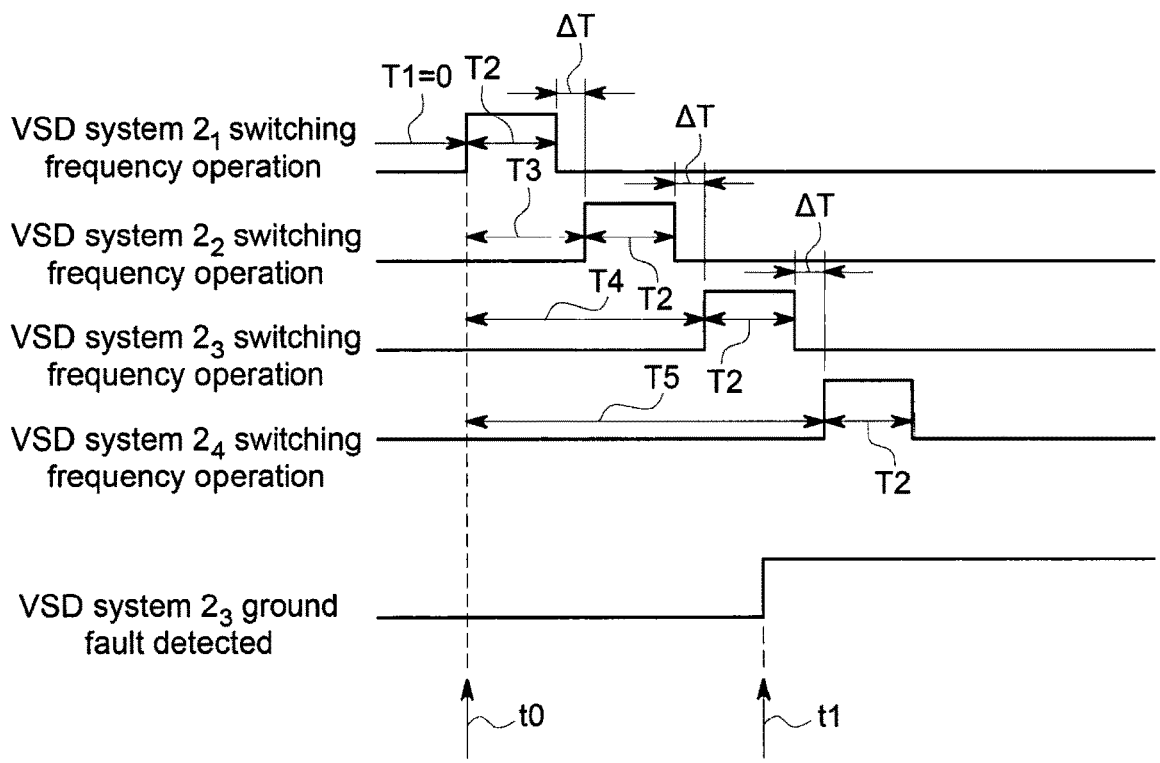
FIGS. 8A and 8B show a switching frequency process according to the present invention.
Figure 8B:
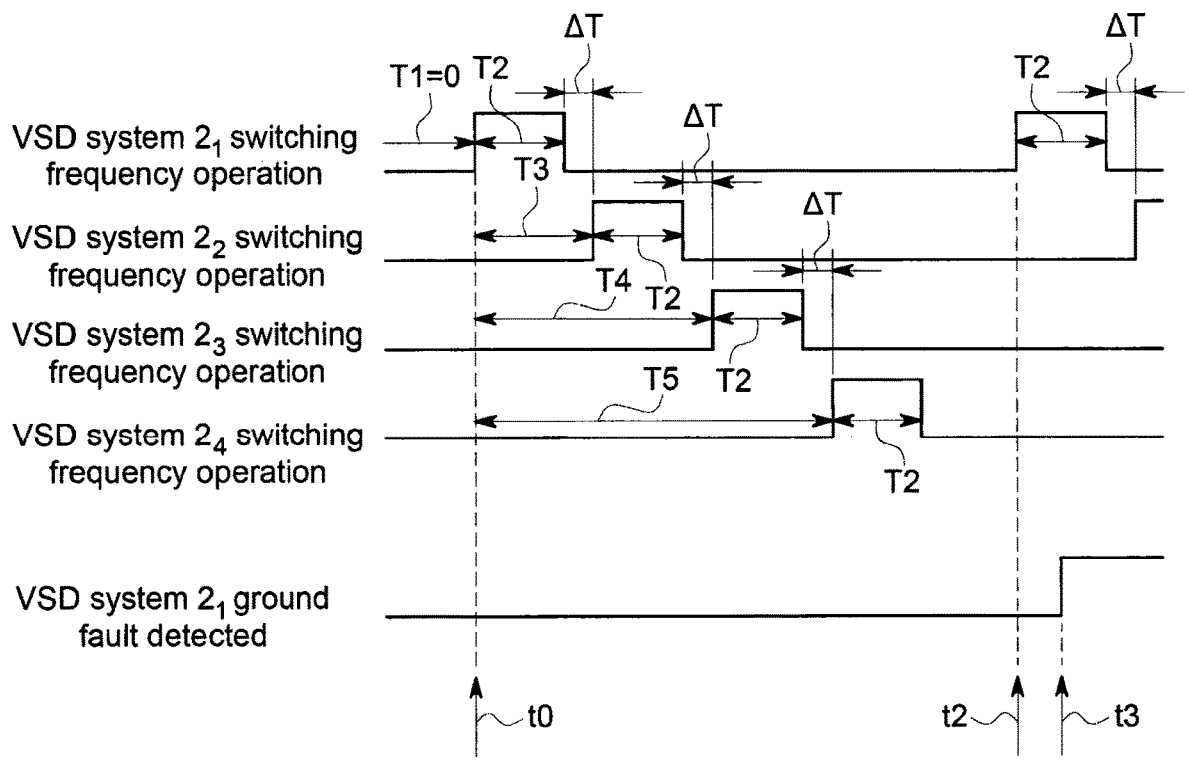

FIGS. 8A and 8B show how the switching frequency operations are applied sequentially to each of the four power converters $3_1$-$3_4$. It is assumed that an unspecified ground fault is detected at time t0 and that the switching frequency process is initiated simultaneously at t0 in all controllers $12_1$-$12_4$. The first controller $12_1$ waits for a predetermined period of time T1 before applying the switching frequency operation to the first power converter $3_1$. (In the switching frequency process shown in FIGS. 8A and 8B, T1=0 so the switching frequency operation is applied immediately to the first power converter $3_1$.) The switching frequency operation is applied to the first power converter $3_1$ for a predetermined period of time T2 during which the supply bridge $3A_1$ and the machine bridge $3B_1$ of the first power converter $3_1$ are operated at the displaced switching frequency (i.e., $Fc_1$=$Fs_1$=$Fm_1$=2.0 kHz) but the supply bridge and the machine bridge of the second, third and fourth power converters $3_2$, $3_3$ and $3_4$ continue to operate at the nominal switching frequency of 2.5 kHz (i.e., $Fc_2$-4=$Fs_2$-4=$Fm_2$-4=2.5 kHz). The second controller $12_2$ waits for a predetermined period of time T3 before applying the switching frequency operation to the second power converter $3_2$. In the switching frequency process shown in FIGS. 8A and 8B, T3=T2+ΔT where ΔT is a predetermined delay that provides a gap between the sequential switching frequency operations. The switching frequency operation is applied to the second power converter $3_2$ for a predetermined period of time T2 during which the supply bridge $3A_2$ and the machine bridge $3B_2$ of the second power converter $3_2$ are operated at the displaced switching frequency of 2.0 kHz (i.e., $Fc_2$=$Fs_2$=$Fm_2$=2.0 kHz) but the supply bridge and the machine bridge of the first, third and fourth power converters $3_1$, $3_3$ and $3_4$ are operated at the nominal switching frequency of 2.5 kHz (i.e., $Fc_{1,3,4}$=$Fs_{1,3,4}$=$Fm_{1,3,4}$=2.5 kHz). The third controller $12_3$ waits for a predetermined period of time T4 before applying the switching frequency operation to the third power converter $3_3$. In the switching frequency process shown in FIGS. 8A and 8B, T4=(T3+T2)+ΔT. The switching frequency operation is applied to the third power converter $3_3$ for a predetermined period of time T2 during which the supply bridge $3A_3$ and the machine bridge $3B_3$ of the third power converter $3_3$ are operated at the displaced switching frequency of 2.0 kHz (i.e., $Fc_3$=$Fs_3$=$Fm_3$=2.0 kHz) but the supply bridge and machine bridge of the first, second and fourth power converters $3_1$, $3_2$ and $3_4$ are operated at the nominal switching frequency of 2.5 kHz (i.e., $Fc_{1,2,4}$=$Fs_{1,2,4}$=$Fm_{1,2,4}$=2.5 kHz). The fourth controller $12_4$ waits for a predetermined period of time T5 before applying the switching frequency operation to the fourth power converter $3_4$. In the switching frequency process shown in FIGS. 8A and 8B, T5=(T4+T2)+ΔT. The switching frequency operation is applied to the fourth power converter $3_4$ for a predetermined period of time T2 during which the supply bridge $3A_4$ and the machine bridge $3B_4$ of the fourth power converter $3_4$ are operated at the displaced switching frequency of 2.0 kHz (i.e., $Fc_4$=$Fs_4$=$Fm_4$=2.0 kHz) but the supply bridge and the machine bridge of the first, second and third power converters $3_1$, $3_2$ and $3_3$ are operated at the nominal switching frequency of 2.5 kHz (i.e., $Fc_{1,2,3}$=$Fs_{1,2,3}$=$Fm_{1,2,3}$=2.5 kHz).

In the switching frequency process shown in FIG. 8A, a fault location determination is made by the third controller $12_3$ at time t1.

Figure 9A:
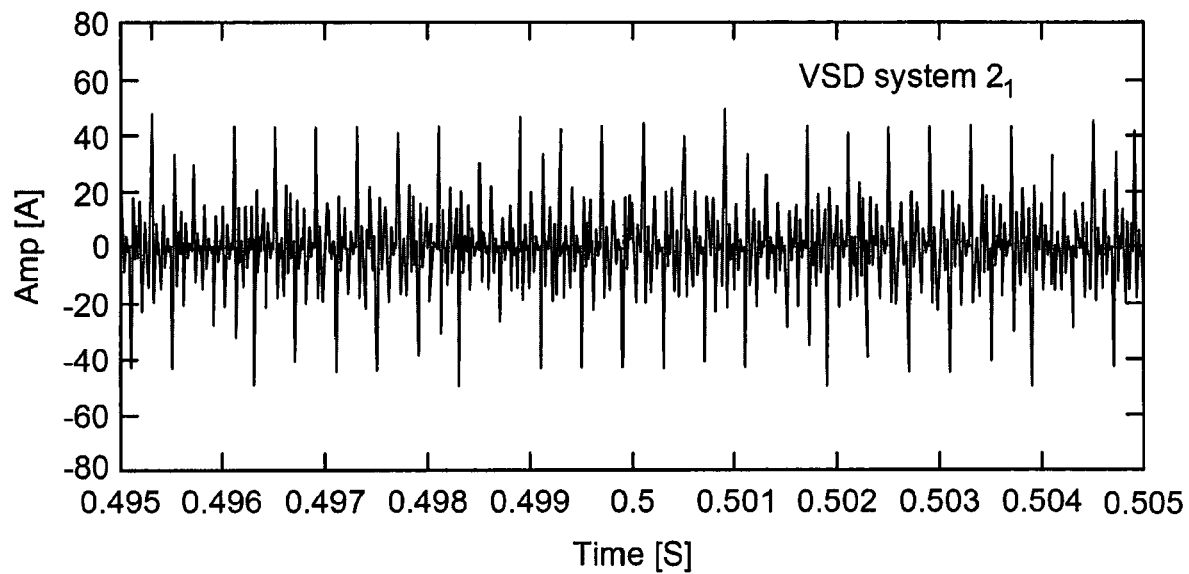
FIGS. 9A and 9B show measured zero sequence currents for two variable speed drive (VSD) systems.
Figure 9B:
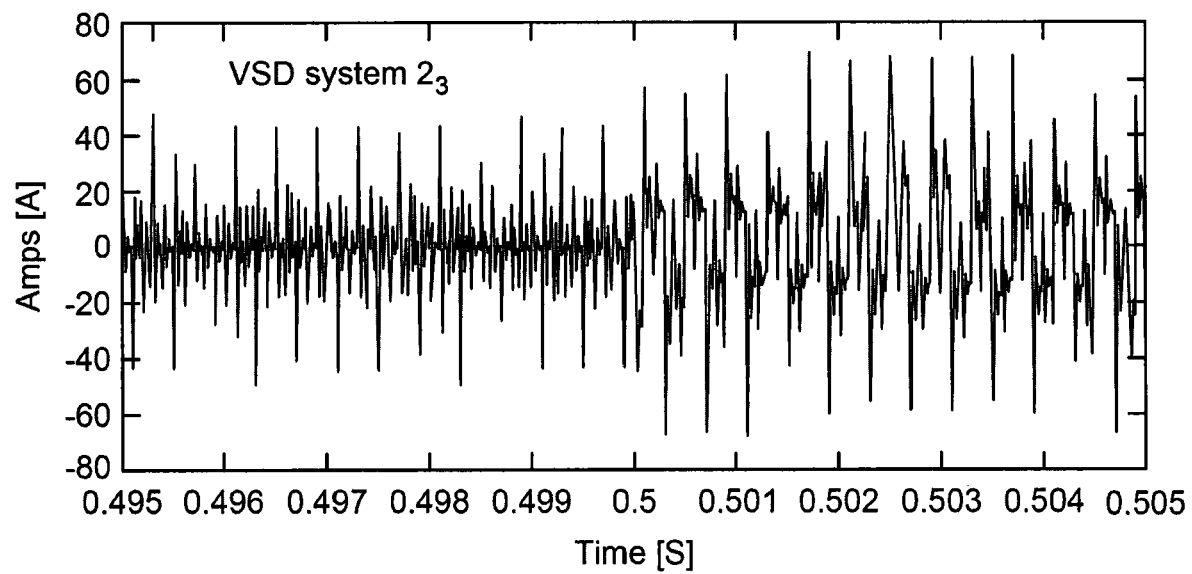

FIGS. 9A and 9B show measured zero sequence currents for the first VSD system $2_1$ and the third VSD system $2_3$, respectively, where a ground fault occurs in the third VSD system at time 0.5 sec (i.e., t0=0.5 sec).

Figure 10A:
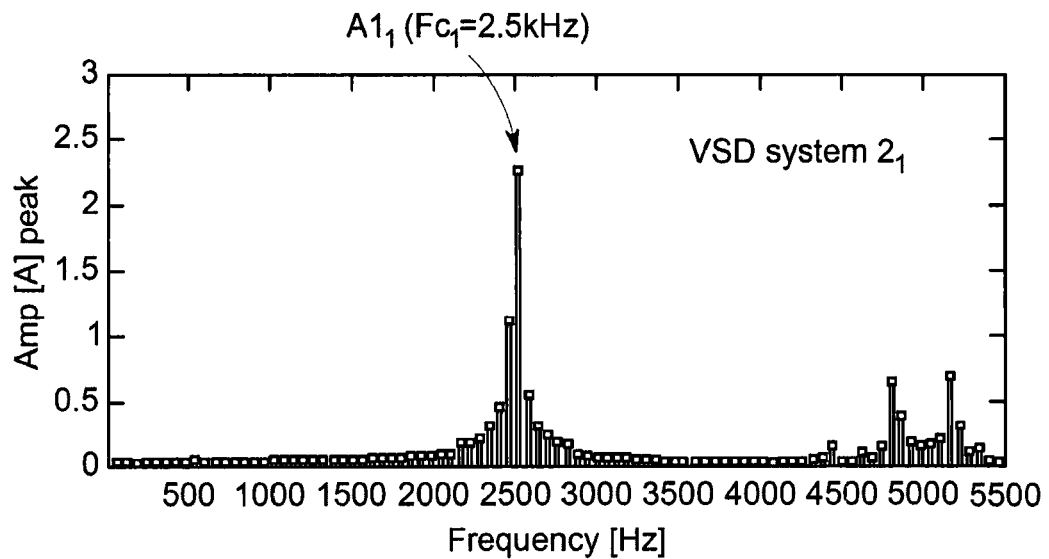
FIGS. 10A and 10B show zero sequence current frequency spectra for the VSD systems of FIGS. 9A and 9B before a ground fault occurs in one of the VSD systems.
Figure 10B:
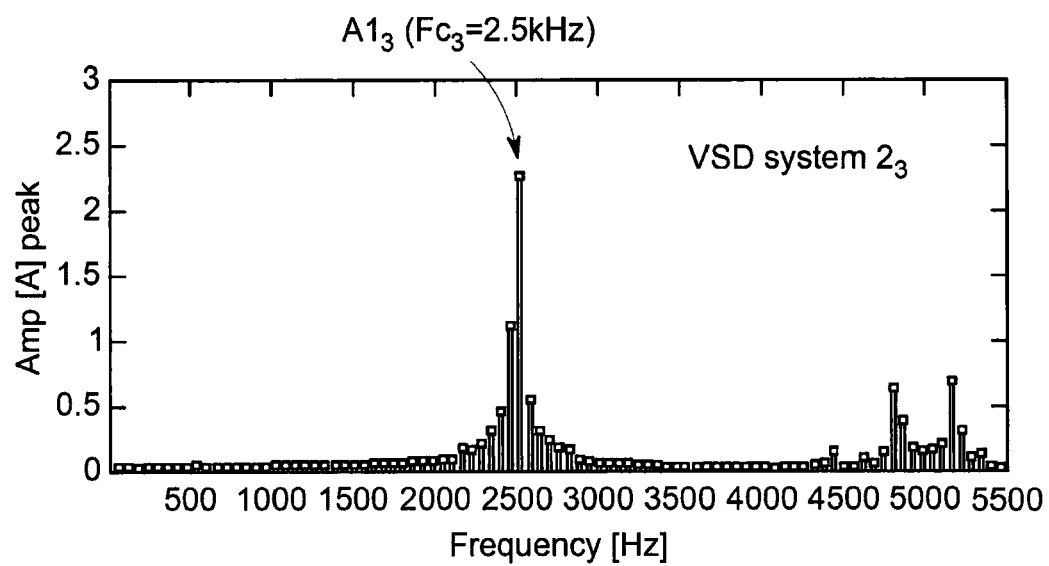

FIGS. 10A and 10B show the zero sequence current frequency spectra for the first VSD system $2_1$ and the third VSD system $2_3$, respectively, for a time window before the ground fault occurs in the third VSD system (i.e., t<0.5 sec). It can be seen that the particular first amplitudes $A1_1(Fc_1)$ and $A1_3(Fc_3)$ are about 2.2 A where $Fc_1$=$Fc_3$=2.5 kHz.

Figure 11A:
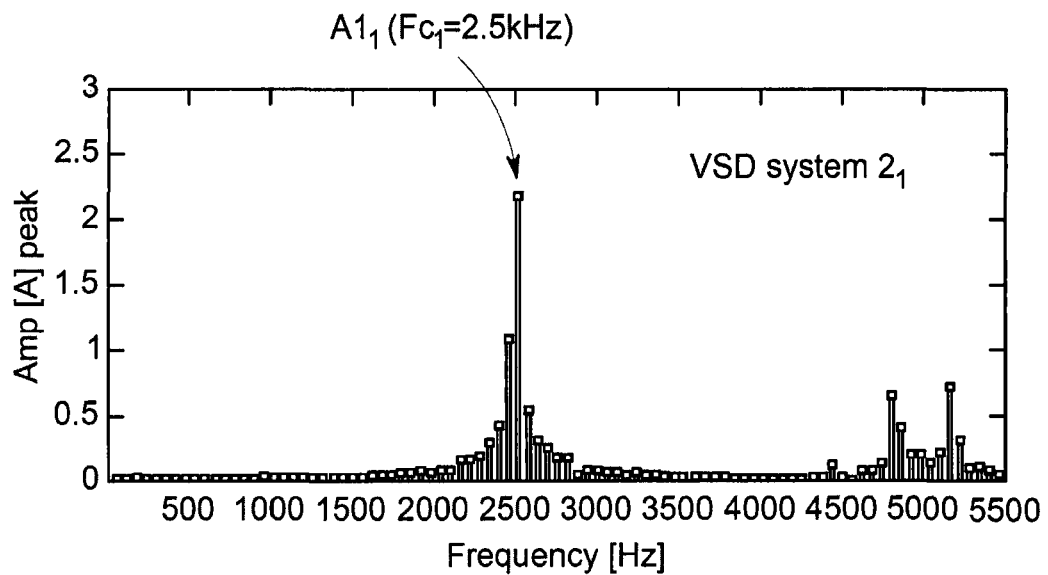
FIGS. 11A and 11B show zero sequence current frequency spectra for the VSD systems of FIGS. 9A and 9B after a ground fault occurs in one of the VSD systems.
Figure 11B:
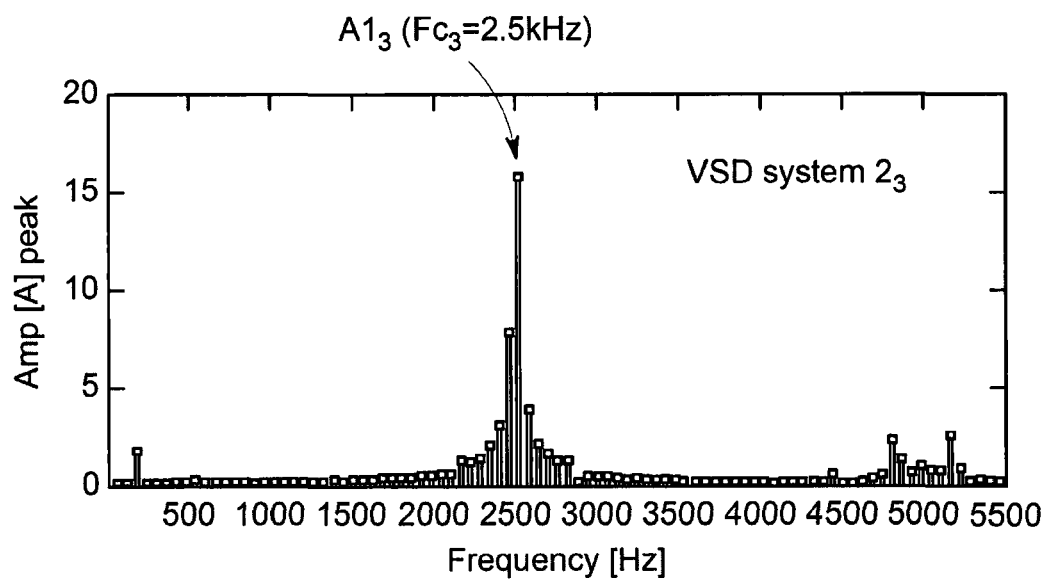

FIGS. 11A and 11B show the zero sequence current frequency spectra for the first VSD system $2_1$ and the third VSD system $2_3$, respectively, for a time window after the ground fault occurs in the third VSD system but before any switching frequency operations are applied. It can be seen that the particular first amplitude $A1_1(Fc_1)$ is still about 2.2 A and the particular amplitude $A1_3(Fc_3)$ has increased to about 17 A as a result of the propagating zero sequence fault currents where $Fc_1=Fc_3=2.5$ kHz.

Figure 12A:
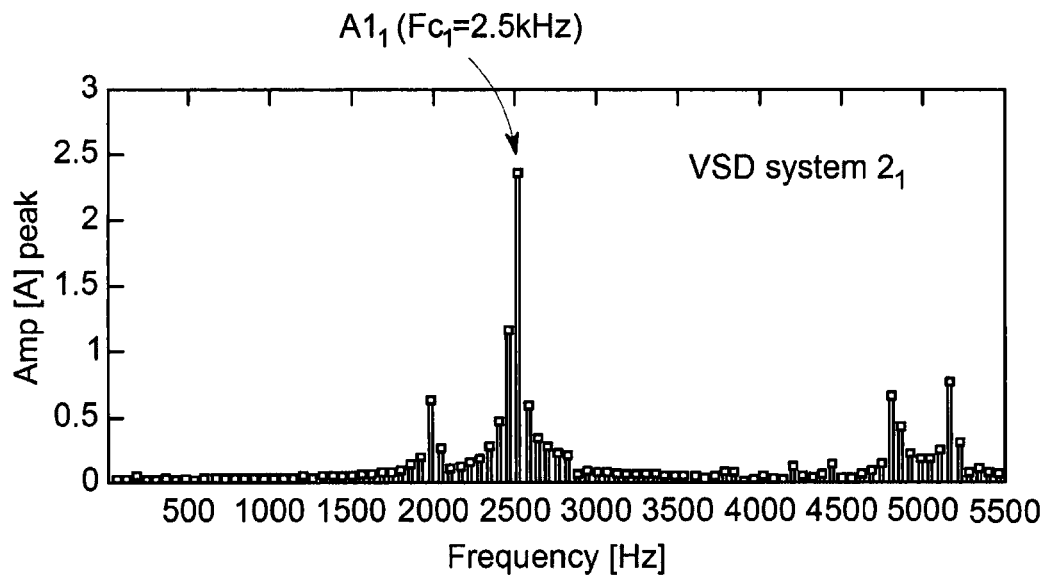
FIGS. 12A and 12B show zero sequence current frequency spectra for the VSD systems of FIGS. 9A and 9B when a switching frequency operation is applied to the faulty VSD system.
Figure 12B:
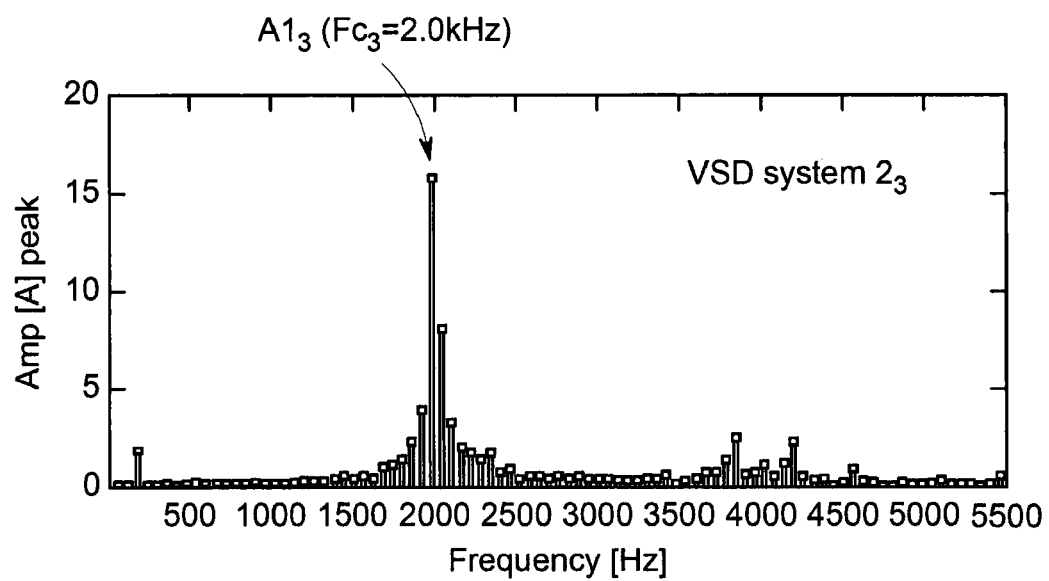

Considering just the third VSD system $2_3$, the spectrum analysis process carried out by the third controller $12_3$ will derive first amplitudes $A1_3(Fc_3)$ during the predetermined period of time T4 where $Fc_3=2.5$ kHz and will compare them against the first fault location threshold $L1_3(Fc_3)$. In some situations, it is possible that the first amplitudes will exceed the first fault location threshold during the predetermined period of time T4, i.e., $A1_3(Fc_3)>L1_3(Fc_3)$ where $Fc_3=2.5$ kHz. In this case a signal 20 is generated by the third controller $12_3$ and used to open a protective circuit breaker $21_3$ for the third VSD system $3_2$ and/or to trip the VSD system. But in practice it will normally be expected that the first amplitudes will not exceed the first fault location threshold during the predetermined period of time T4 because of the relatively poor signal to noise ratio. The switching frequency operation is applied to the third power converter $3_3$ which will operate at the displaced switching frequency for a predetermined period of time T2. The spectrum analysis process carried out by the third controller $12_3$ will derive first amplitudes $A1_3(Fc_3)$ during the predetermined period of time T2 where $Fc_3=2.0$ kHz and will compare them against the first fault location threshold $L1_3(Fc_3)$. FIGS. 12A and 12B show the zero sequence current frequency spectra for the first VSD system $2_1$ and the third VSD system $2_3$, respectively, for a time window during the predetermined period of time T2 when the switching frequency operation is applied to the third power converter $3_3$. It can be seen that the particular first amplitude $A1_1(Fc_1)$ is still about 2.2 A where $Fc_1=2.5$ kHz and the particular first amplitude $A1_3(Fc_3)$ is about 16 A where $Fc_3=2.0$ kHz. The first fault location thresholds $L1_3(Fc_3)$ for $Fc_3=2.5$ kHz and $Fc_3=2.0$ kHz can be the same or different. Because the ground fault is located in the third VSD system $2_3$, the first amplitudes will exceed the first fault location threshold during the predetermined period of time T2 when the signal to noise ratio is significantly improved, i.e., $A1_3(Fc_3)>L1_3(Fc_3)$ where $Fc_3=2.0$ kHz. For example, with reference to FIGS. 12A and 12B, the first fault location threshold $L1_3(Fc_3)$ can be 2.5 A for $Fc_3=2.0$ kHz because this is not exceeded before the ground fault occurs or before the switching frequency operation is applied to the third converter $3_3$—see also FIGS. 10B and 11B. But the first fault location threshold $L1_3(Fc_3)$ for $Fc_3=2.0$ kHz would be exceeded when the switching frequency operation is applied to the third converter $3_3$—see FIG. 12B. In this case a signal 20 is generated by the third controller $12_3$ and used to open a protective circuit breaker $21_3$ for the third VSD system $2_3$ and/or to trip the third VSD system. Each controller $12_1$-$12_4$ can additionally derive second amplitudes $A2_1(Fd_1)$-$A2_4(Fd_4)$ and third amplitudes $A3_1(F1_1)$-$A3_4(F1_4)$. The second and third amplitudes $A2_3(Fd_3)$ and $A3_3(F1_3)$ derived by the third controller $12_3$ can optionally be used to determine the precise location of the ground fault within the third VSD system $2_3$.

Figure 13A:
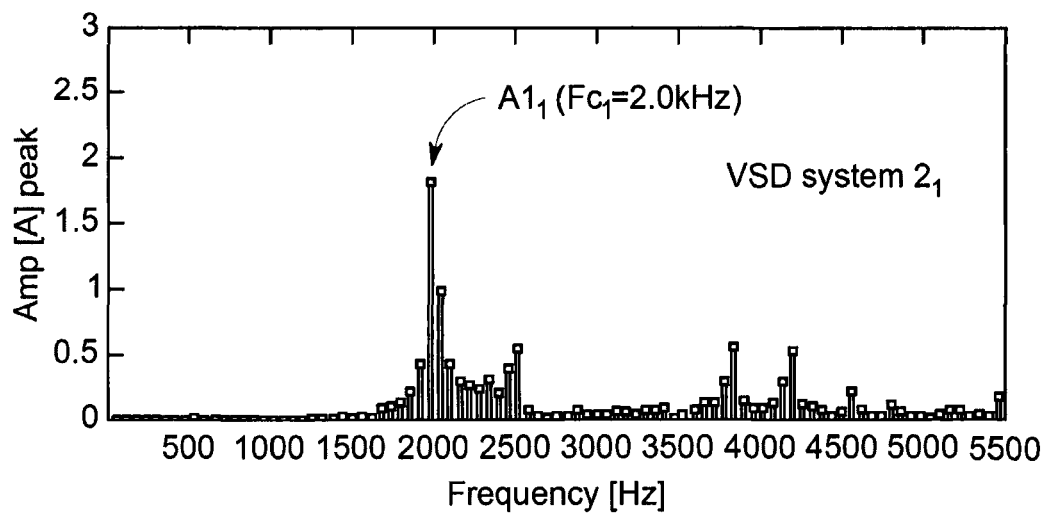
FIGS. 13A and 13B show zero sequence current frequency spectra for the VSD systems of FIGS. 9A and 9B when a switching frequency operation is applied to the non-faulty VSD system.
Figure 13B:
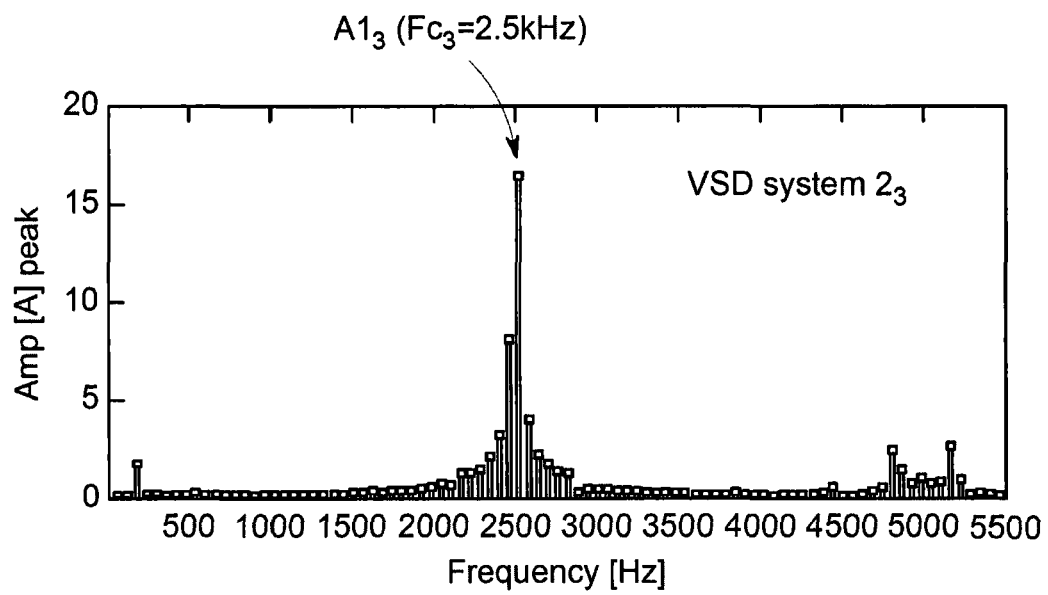

At the end of the switching frequency operation, the third power converter $3_3$ will revert back to being operated at the nominal switching frequency for the remainder of the switching frequency process. Switching frequency operations will be applied to the first, second and fourth power converter $3_1$, $3_2$ and $3_4$ in the same manner but the first amplitudes should not exceed the respective first fault location threshold at either the fundamental component of the nominal switching frequency or the displaced switching frequency. For example, FIGS. 13A and 13B show the zero sequence current frequency spectra for the first VSD system $2_1$ and the third VSD system $2_3$, respectively, for a time window during the period of time T2 when the switching frequency operation is applied to the first power converter $3_1$. It can be seen that the particular first amplitude $A1_1(Fc_1)$ is about 1.8 A where $Fc_1=2.0$ kHz and the particular first amplitude $A1_3(Fc_3)$ is still about 17 A where $Fc_3=2.5$ kHz. If $L1_1(Fc_1)$ is 2.5 A for $Fc_1=2.0$ kHz it will not be exceeded before the ground fault occurs or when the switching frequency operation is applied to the first converter $3_1$, i.e., $A1_1(Fc_1)<2.5$ A.

It will be appreciated that FIGS. 10A, 10B, 11A, 11B, 12A, 12B, 13A and 13B show the amplitudes for all zero sequence current frequencies up to 5.5 kHz. But in practice the DSP technique will isolate just the one or more desired frequency components from the zero sequence current frequency spectra.

In the switching frequency process shown in FIG. 8B, the switching frequency operations are applied sequentially to each of the four power converters $3_1$-$3_4$ without a fault location determination being made. The switching frequency process is therefore repeated with the first controller $12_1$ applying the switching frequency operation to the first power converter $3_1$ for a second time at time t2. The switching frequency operation is then applied to sequentially to the second, third and fourth power converters $3_2$, $3_3$ and $3_4$ as described above. FIG. 8B shows a fault location determination being made by the first controller $12_1$ at time t3.

FIG. 8A shows how a ground fault might be located in the third VSD system $2_3$ and that this is detected by the third controller $12_3$ at time t1. It will be noted that even when a ground fault is located in the third VSD system $2_3$ by the third controller $12_3$, the switching frequency operation will still be applied to the fourth power converter $3_4$ by the fourth controller $12_4$ because the controllers are operated independently. Similarly, FIG. 8B shows how a ground fault might be located in the first VSD system $2_1$ and that this is detected by the first controller $12_1$ at time t3 when the switching frequency process is repeated. It will be noted that even when a ground fault is located in the first VSD system $2_1$ by the first controller $12_1$, the switching frequency operation will still be applied for a second time to the second, third and fourth power converters $3_2$, $3_3$ and $3_4$ by the second, third and fourth controllers $12_2$, $12_3$ and $12_4$ because the controllers are operated independently.

Figure 14:
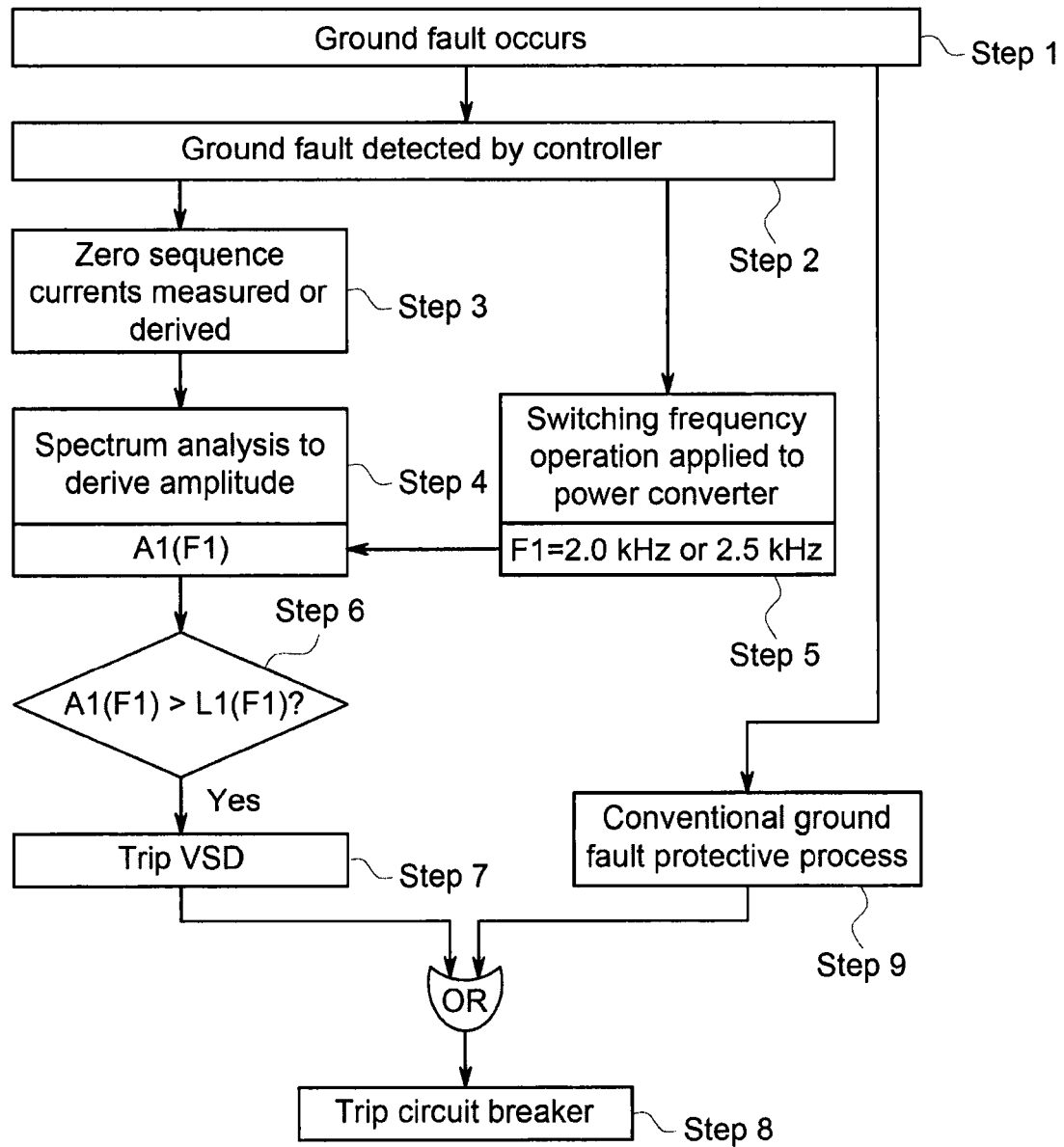
FIG. 14 is a flow chart of the switching frequency process.

The third switching frequency process described above is now summarised for one controller with reference to the flowchart shown in FIG. 14.

Step 1: A ground fault occurs that affects all VSD systems.
Step 2: The ground fault is detected by the controller at t0
Step 3: The zero sequence currents for the associated power converter system are measured or derived, e.g., using a CBCT or CT.
Step 4: The controller applies a spectrum analysis to the zero sequence currents and derives a series of amplitudes A1(F1).
Step 5: After a predetermined time delay, the controller applies a frequency switching operation to the respective VSD system where the switching frequency of the supply bridge and the machine bridge is changed from the nominal switching frequency to the displaced switching frequency for a predetermined period of time before reverting back to the nominal switching frequency. F1 will be the fundamental component of the displaced switching frequency (F1=2.0 kHz) when a frequency switching operation is applied to the VSD system and the fundamental component of the nominal switching frequency (F1=2.5 kHz) at all other times.

Step 6: The controller compares the derived amplitudes A1(F1) against the corresponding fault location threshold L1(F1), which can be preset or derived using power converter system parameters.

Step 7: If a derived amplitude A1(F1) is greater than the corresponding fault location threshold L1(F1) the VSD system is tripped.

Step 8: A signal that is indicative that a ground fault is present in the VSD system is provided to trip the associated protective circuit breaker/switchgear and isolate the VSD system from the distribution bus 5. This signal is in an embodiment generated before the circuit breaker/switchgear is tripped by a conventional ground fault protective process that is effective within the switchboard that incorporates the associated circuit breaker/switchgear for the VSD system (Step 9).

What we claim is:

1. A ground fault protection method for a power distribution system comprising a plurality of power converter systems electrically connected to a point of common coupling, each power converter system including a power converter with a plurality of semiconductor switching devices controlled using a pulse width modulation strategy with a switching frequency, the method comprising:
   applying a spectrum analysis process to each power converter system that uses measured or derived zero sequence currents associated with the respective power converter system to determine the location of a ground fault within the power distribution system, and
   applying a switching frequency process where the switching frequency of the power converter of at least one of the power converter systems is different from the switching frequency of the power converter of at least another one of the power converter systems during at least part of the time that the spectrum analysis process is applied,
   wherein the power converters are operated continuously at different fixed switching frequencies during normal operation and during a ground fault condition.

2. The method according to claim 1, wherein the spectrum analysis process further uses measured or derived zero sequence currents associated with the respective power converter system to detect a presence of a ground fault at an unspecified location within the power distribution system.

3. The method according to claim 1, wherein the spectrum analysis process comprises:
   measuring or deriving zero sequence currents associated with the respective power converter system;
   performing spectrum analysis on the zero sequence currents and deriving an amplitude of a frequency component within the zero sequence current frequency spectrum; and
   comparing the derived amplitude against a threshold or at least one stored amplitude.

4. The method according to claim 3, wherein a frequency component within the zero sequence current frequency spectrum is a fundamental component or an integer or non-integer harmonic component of the switching frequency of the power converter of the respective power converter system.

5. The method according to claim 3, wherein the threshold is a fixed threshold or a variable threshold that can be derived using a look-up table.

6. The method according to claim 3, wherein the spectrum analysis process generates a signal indicative of a ground fault being present at an unspecified location within the power distribution system if the amplitude exceeds a fault detection threshold.

7. The method according to claim 3, wherein the spectrum analysis process generated a signal indicative of a ground fault being present within the respective power converter system if the amplitude exceeds a fault location threshold, the signal be used to open a protective circuit breaker/switchgear for the respective power converter system to isolate it from the point of common coupling and/or trip the power converter system.

8. The method according to claim 3, wherein the power converters are operated continuously with a pseudo random series of different switching frequencies during normal operation and during a ground fault condition.

9. A ground fault protection method for a power distribution system comprising a plurality of power converter systems electrically connected to a point of common coupling, each power converter system including a power converter with a plurality of semiconductor switching devices controlled using a pulse width modulation strategy with a switching frequency, the method comprising:
   applying a spectrum analysis process to each power converter system that uses measured or derived zero sequence currents associated with the respective power converter system to determine the location of a ground fault within the power distribution system, and
   applying a switching frequency process where the switching frequency of the power converter of at least one of the power converter systems is different from the switching frequency of the power converter of at least another one of the power converter systems during at least part of the time that the spectrum analysis process is applied,
   wherein the power converters are operated at a nominal switching frequency during normal operation and a switching frequency operation is then sequentially applied to each power converter system without overlap in response to ground fault detection, wherein during each switching frequency operation the respective power converter is operated at a switching frequency that is different from the nominal switching frequency.

10. The method according to claim 9, wherein a gap is provided between each of the switching frequency operations.

11. A power distribution system comprising:
    a plurality of power converter systems electrically connected to a point of common coupling, each power converter system including a power converter with a plurality of semiconductor switching devices controlled using a pulse width modulation strategy with a switching frequency, a controller for each power converter system,
    each controller being adapted to apply a spectrum analysis process to the respective power converter system that uses measured or derived zero sequence currents associated with the respective power converter system to determine the location of a ground fault within the power distribution system, and
    each controller being adapted to apply a switching frequency process where the switching frequency of the power converter of at least one of the power converter systems is different from the switching frequency of the power converter of at least another one of the power converter systems during at least part of the time that the spectrum analysis process is applied, wherein the power converters are operated continuously at different fixed switching frequencies during normal operation and during a ground fault condition.

12. The power distribution system according to claim 11, wherein each power converter comprises a single power converter module.

13. The power distribution system according to claim 11, wherein each power converter comprises a first power converter module and a second power converter module, electrically connected together by a dc link.

14. The power distribution system according to claim 11, wherein each power converter system comprises an ac line filter, comprising at least one filter reactor and a filter capacitor connected to aground.

* * * * *